United States Patent
Kawashima et al.

(10) Patent No.: US 11,245,249 B2
(45) Date of Patent: Feb. 8, 2022

(54) REFLECTOR, SURFACE EMITTING LASER, METHOD FOR MANUFACTURING REFLECTOR, AND METHOD FOR MANUFACTURING SURFACE EMITTING LASER

(71) Applicant: Ricoh Company, Ltd., Tokyo (JP)

(72) Inventors: Takeshi Kawashima, Miyagi (JP); Shunichi Sato, Miyagi (JP); Morimasa Kaminishi, Miyagi (JP); Hirokazu Iwata, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/287,541

(22) Filed: Feb. 27, 2019

(65) Prior Publication Data

US 2019/0273360 A1    Sep. 5, 2019

(30) Foreign Application Priority Data

Mar. 1, 2018  (JP) .............................. JP2018-036354
Dec. 13, 2018  (JP) .............................. JP2018-233726

(51) Int. Cl.
*H01S 5/183*  (2006.01)
*H01S 5/22*   (2006.01)
(Continued)

(52) U.S. Cl.
CPC .......... *H01S 5/18361* (2013.01); *F21S 41/16* (2018.01); *F21S 41/176* (2018.01);
(Continued)

(58) Field of Classification Search
CPC ...... G02B 5/0816; G02B 5/0825–0833; H01S 5/18361–1838; H01S 5/18377;
(Continued)

(56) References Cited

U.S. PATENT DOCUMENTS 5,052,016 A * 9/1991 Mahbobzadeh ....... B82Y 20/00
                                                        372/50.11
5,063,569 A * 11/1991 Xie ..................... H01S 5/18369
                                                        372/45.01
(Continued)

FOREIGN PATENT DOCUMENTS

DE    102017108322 A1 * 10/2018 ............. H01S 5/021
JP    2000-349393       12/2000
(Continued)

OTHER PUBLICATIONS

Kazuki Ikeyama, et al., "Room-temperature continuous-wave operation of GaN-based vertical-cavity surface-emitting lasers with n-type conducting AlInN/GaN distributed Bragg reflectors" © 2016 The Japan Society of Applied Physics Express 9, p. 102101-1-102101-4.

*Primary Examiner* — Joshua King
(74) *Attorney, Agent, or Firm* — Xsensus LLP

(57) ABSTRACT

A reflector includes a low refractive index layer and a high refractive index layer. The low refractive index layer has a first average refractive index and has a laminated structure in which an AlN layer and a GaN layer are alternately laminated. The high refractive index layer has a second average refractive index higher than the first average refractive index and includes an InGaN layer.

23 Claims, 19 Drawing Sheets

(51) Int. Cl.
  *H01S 5/024* (2006.01)
  *H01S 5/343* (2006.01)
  *H01S 5/42* (2006.01)
  *H01S 5/042* (2006.01)
  *G03B 21/20* (2006.01)
  *F21S 41/176* (2018.01)
  *F21S 41/16* (2018.01)
  *G02B 26/08* (2006.01)
  *G02B 26/10* (2006.01)

(52) U.S. Cl.
  CPC ...... *G03B 21/2033* (2013.01); *H01S 5/02461* (2013.01); *H01S 5/18347* (2013.01); *H01S 5/2206* (2013.01); *H01S 5/34333* (2013.01); *H01S 5/423* (2013.01); *G02B 26/0833* (2013.01); *G02B 26/10* (2013.01); *H01S 5/0425* (2013.01); *H01S 2301/173* (2013.01); *H01S 2304/04* (2013.01)

(58) Field of Classification Search
  CPC .... H01S 5/1838; H01S 5/34333; H01S 5/423; H01S 5/18341; H01S 5/18344–18352; H01S 5/0421; H01S 5/0425; H01S 5/04254; H01S 5/04256; H01S 5/1836; H01S 5/18372; H01S 5/4087–4093
  See application file for complete search history.

(56) References Cited

U.S. PATENT DOCUMENTS

| | | | | |
|---|---|---|---|---|
| 6,259,715 | B1 * | 7/2001 | Nakayama | H01S 5/423 372/50.1 |
| 6,320,891 | B1 * | 11/2001 | Seko | B82Y 20/00 372/50.21 |
| 6,597,017 | B1 * | 7/2003 | Seko | H01S 5/32341 257/103 |
| 8,093,606 | B2 * | 1/2012 | Sonobe | B82Y 20/00 257/98 |
| 8,680,570 | B2 * | 3/2014 | Therrien | H01L 29/2003 257/103 |
| 9,590,391 | B2 * | 3/2017 | Kawashima | B41J 2/473 |
| 10,205,303 | B1 * | 2/2019 | Hegblom | H01S 5/183 |
| 2007/0025408 | A1 * | 2/2007 | Koelle | H01S 5/18308 372/50.124 |
| 2008/0056320 | A1 * | 3/2008 | Takeuchi | H01S 5/34333 372/45.01 |
| 2009/0052490 | A1 * | 2/2009 | Maeda | H01S 5/187 372/50.11 |
| 2009/0245312 | A1 * | 10/2009 | Kageyama | H01S 5/423 372/46.01 |
| 2013/0343418 | A1 * | 12/2013 | Gerlach | H01S 5/423 372/45.01 |
| 2014/0354367 | A1 * | 12/2014 | Suzuki | H01S 5/42 331/94.1 |
| 2014/0377459 | A1 * | 12/2014 | Kawashima | H01S 5/187 427/162 |
| 2015/0139261 | A1 * | 5/2015 | Matsuo | H01L 33/04 372/50.11 |
| 2016/0268774 | A1 * | 9/2016 | Kawashima | B41J 2/447 |

FOREIGN PATENT DOCUMENTS

| | | | |
|---|---|---|---|
| JP | 2002-511659 | 4/2002 | |
| JP | 2004-079852 | 3/2004 | |
| JP | 2005-311072 | 11/2005 | |
| JP | 2008-523623 | 7/2008 | |
| JP | 2018-125404 | 8/2018 | |
| WO | WO1999/053578 A1 | 10/1999 | |
| WO | WO2006/062880 A2 | 6/2006 | |
| WO | WO-2016195695 A1 * | 12/2016 | ........... H01L 27/156 |
| WO | WO-2018153744 A1 * | 8/2018 | ......... H01S 5/02208 |

* cited by examiner

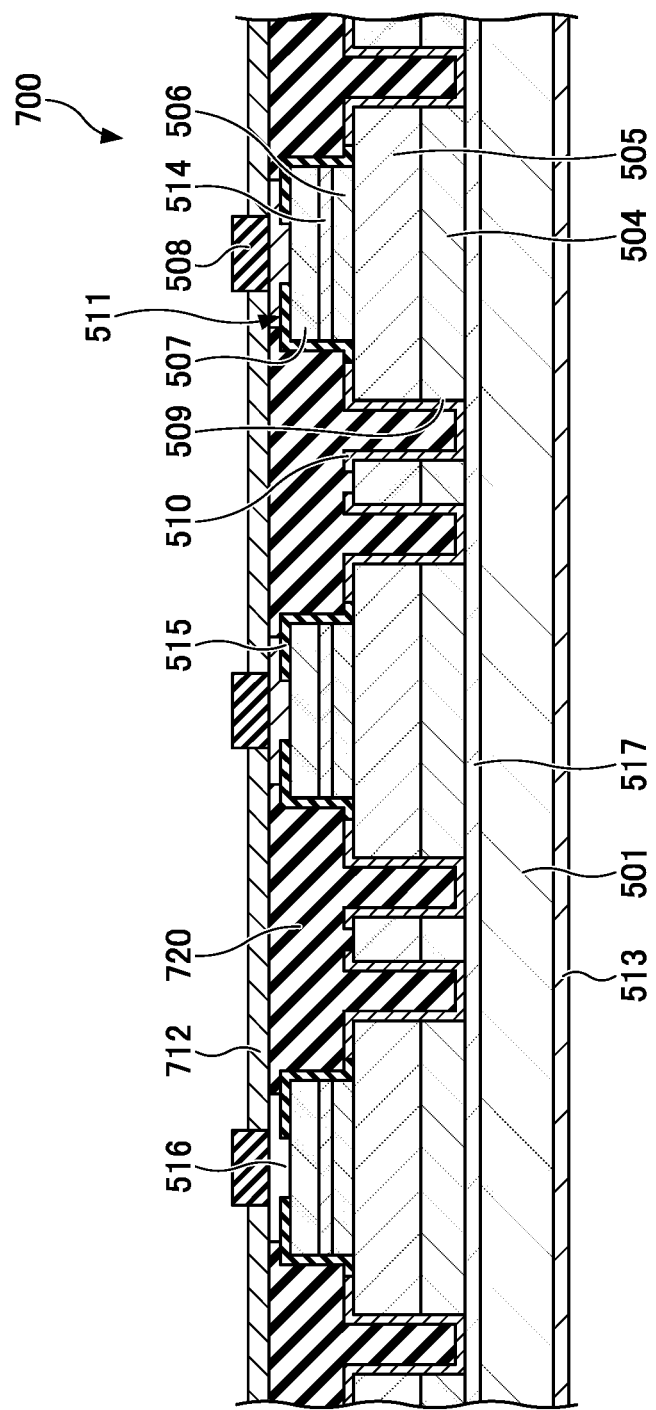

REFLECTOR, SURFACE EMITTING LASER, METHOD FOR MANUFACTURING REFLECTOR, AND METHOD FOR MANUFACTURING SURFACE EMITTING LASER

CROSS-REFERENCE TO RELATED APPLICATIONS

This patent application is based on and claims priority pursuant to 35 U.S.C. § 119(a) to Japanese Patent Application Nos. 2018-036354, filed on Mar. 1, 2018, 2018-233726, filed on Dec. 13, 2018, in the Japan Patent Office, the entire disclosure of which is hereby incorporated by reference herein.

BACKGROUND

Technical Field

The present invention relates to a reflector, a surface emitting laser, a method for manufacturing a reflector, and a method for manufacturing a surface emitting laser.

Discussion of the Background Art

A vertical cavity surface emitting laser (VCSEL) is a laser in which a thin active layer is sandwiched between a pair of reflectors and a resonator is formed in a direction perpendicular to a substrate. Therefore, a reflector forming a resonator of a surface emitting laser (distributed Bragg reflector (DBR)) may require a reflectance of 99% or more.

Regarding the configuration of the reflector, a DBR in which InGaN and AlGaN are laminated in cycles has been proposed.

However, the above DBR in which InGaN and AlGaN are laminated in cycles has a disadvantage of poor heat dissipation.

SUMMARY

Example embodiments include a reflector including a low refractive index layer and a high refractive index layer. The low refractive index layer has a first average refractive index and has a laminated structure in which an AlN layer and a GaN layer are alternately laminated. The high refractive index layer has a second average refractive index higher than the first average refractive index and includes an InGaN layer.

BRIEF DESCRIPTION OF THE DRAWINGS

A more complete appreciation of the disclosure and many of the attendant advantages and features thereof can be readily obtained and understood from the following detailed description with reference to the accompanying drawings, wherein:

FIG. 9A is a cross-sectional view illustrating a two-dimensional array light source according to a seventh embodiment;

Figure 1:
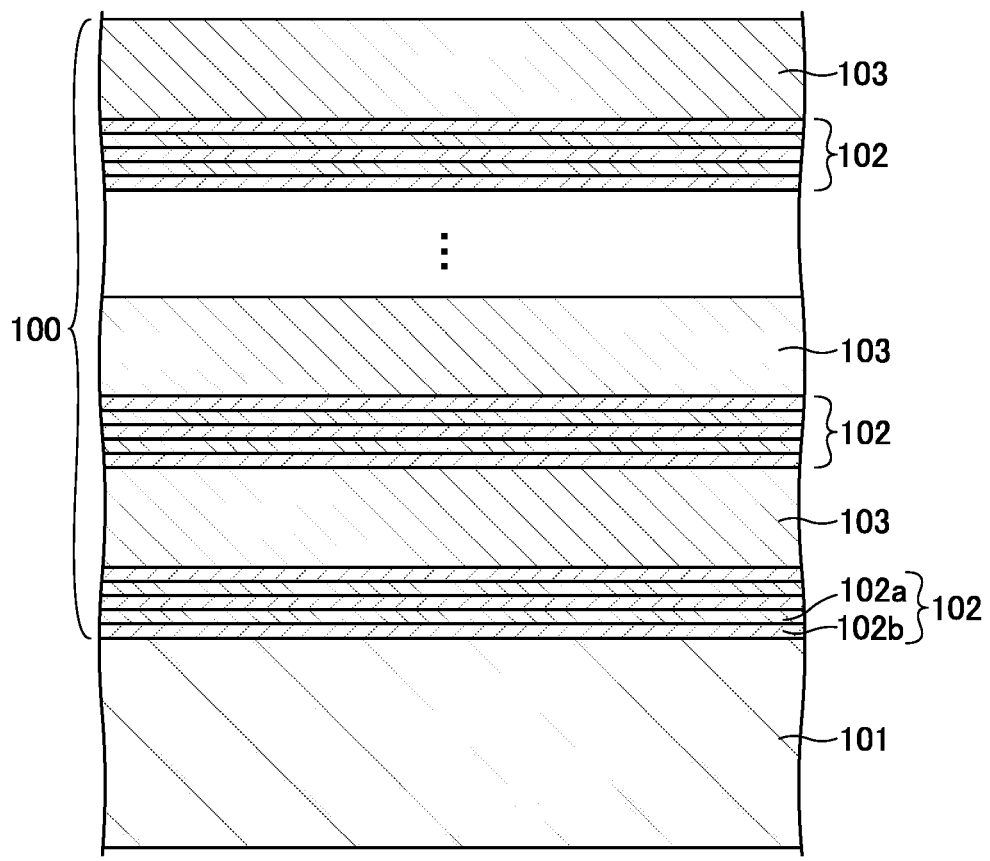
FIG. 1 is a cross-sectional view illustrating a reflector according to a first embodiment.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Hereinafter, embodiments of the present disclosure will be described with reference to the attached drawings. Incidentally, in the present specification and the drawings, the same reference numerals are attached to constituent elements having substantially the same functional configuration, and redundant explanations may be omitted.

First Embodiment

First, a first embodiment will be described. The first embodiment relates to a reflector. FIG. 1 is a cross-sectional view illustrating the reflector according to the first embodiment.

As illustrated in FIG. 1, in a reflector 100 according to the first embodiment, a low refractive index layer 102 having a laminated structure in which an AlN layer 102a and a GaN layer 102b are alternately laminated and a high refractive index layer 103 including an InGaN layer are alternately laminated. An average refractive index (an example of a first average refractive index) of the low refractive index layer 102 is smaller than an average refractive index (an example of a second average refractive index) of the high refractive index layer 103. The average refractive index of the low refractive index layer 102 is a value obtained by dividing the sum of a product of the optical film thickness and the refractive index of each layer included in the low refractive index layer 102 by the total optical film thickness of the low refractive index layer 102. Similarly, the average refractive index of the high refractive index layer 103 is a value obtained by dividing the sum of a product of the optical film thickness and the refractive index of each layer included in the high refractive index layer 103 by the total optical film thickness of the high refractive index layer 103. The high refractive index layer 103 may include only an InGaN layer, and the average refractive index of the high refractive index layer 103 in this case is the refractive index of the InGaN layer itself.

The reflector 100 is disposed on a substrate 101 containing, for example, GaN to be used. For example, a material of the substrate 101 has a lattice constant of GaN, and a GaN substrate or a GaN template obtained by growing a GaN layer on a heterogeneous substrate can be used as the substrate 101. Examples of the heterogeneous substrate include a sapphire substrate, a Si substrate, a GaAs substrate, and a SiC substrate.

According to the reflector 100, it is possible to achieve an extremely high reflectance, for example, a reflectance of 99.9% or more by a proper combination of the low refractive index layer 102 and the high refractive index layer 103. Since the thermal conductivity of each of the AlN layer 102a and the GaN layer 102b is higher than the thermal conductivity of AlGaN, heat dissipation can be improved.

The low refractive index layer 102 and the high refractive index layer 103 may be undoped semiconductor layers, and the low refractive index layer 102 and the high refractive index layer 103 may be doped with impurities. "Undoped" here means that a layer is not intentionally doped with impurities, and the residual impurity concentration in a crystal is $1 \times 10^{17}$ cm$^{-3}$ or less.

Incidentally, in the low refractive index layer 102, tensile distortion is generated due to lattice mismatch between AlN of the AlN layer 102a and GaN included in the substrate 101. Meanwhile, in the high refractive index layer 103, compressive distortion is generated due to lattice mismatch between InGaN of the high refractive index layer 103 and GaN included in the substrate 101. Therefore, in a case where a difference between the deformation amount generated in the low refractive index layer 102 and the deformation amount generated in the high refractive index layer 103 is large, cracks and pits may be generated at an interface therebetween to decrease a reflectance. In order to suppress such cracks and pits, a difference between a product $P_{AlN}$ of distortion generated in the AlN layer 102a and the total film thickness of the AlN layer 102a and a product $P_{InGaN}$ of distortion generated in the InGaN layer and the total film thickness of the InGaN layer is preferably small. For example, the product $P_{AlN}$ is preferably 0.8 to 1.2 times the product $P_{InGaN}$, more preferably 0.9 to 1.1 times the product $P_{InGaN}$, and still more preferably 1.0 time the product $P_{InGaN}$. Note that the definition of distortion ε is expressed by the following formula. The denominator is an a-axis lattice constant ($a_S$) of the substrate, which is the a-axis lattice constant of GaN here. The numerator is a deformation amount (Δa), which is a value obtained by subtracting the a-axis lattice constant ($a_S$) of GaN from a an-axis lattice constant ($a_e$) of InGaN or AlN here.

$$\varepsilon = \Delta a / a_S = (a_e - a_S) / a_S$$

If a reflection wavelength of the reflector 100 is represented by λ, the optical film thickness of each of the low refractive index layer 102 and the high refractive index layer 103 is, for example, λ/4. If the sum of the optical film thicknesses of the low refractive index layer 102 and the high refractive index layer 103 is λ/2, the optical film thickness of the low refractive index layer 102 and the optical film thickness of the high refractive index layer 103 may be different from each other. For example, the optical film thickness of the high refractive index layer 103 may be larger than λ/4, and the optical film thickness of the low refractive index layer 102 may be smaller than λ/4. As the optical film thickness of the low refractive index layer 102 is smaller, the total film thickness of the AlN layer 102a in the low refractive index layer 102 is larger, the total film thickness of the GaN layer 102b is smaller, the refractive index of the low refractive index layer 102 is lower, and the effective refractive index difference between the low refractive index layer 102 and the high refractive index layer 103 is larger. Therefore, by setting the optical film thickness of the high refractive index layer 103 to be larger than λ/4 and setting the optical film thickness of the low refractive index layer 102 to be smaller than λ/4, the effective refractive index difference can be increased while the difference between the product $P_{AlN}$ and the product $P_{InGaN}$ is reduced.

If the film thickness of the AlN layer 102a is larger than 20 nm in a case where the reflector 100 is grown on the GaN substrate, misfit dislocation may occur due to lattice distortion with GaN or surface roughness may occur due to accumulation of distortion to decrease a reflectance. Therefore, the film thickness of the AlN layer 102a is preferably 20 nm or less, more preferably 15 nm or less, and still more preferably 10 nm or less. Even if the film thickness of each AlN layer 102a is small, by inclusion of two or more AlN layers 102a in the low refractive index layer 102, it is possible to increase the total film thickness of the AlN layer 102a in the low refractive index layer 102. Meanwhile, if the film thickness of the AlN layer 102a is less than 5 nm, it may be impossible to obtain sufficient flatness. Therefore, the film thickness of the AlN layer 102a is preferably 5 nm or more.

In the low refractive index layer 102, not the AlN layer 102a but the GaN layer 102b is preferably adjacent to the high refractive index layer 103. This is because the GaN layer 102b functions as a buffer between AlN and InGaN and good crystal quality can be easily obtained.

More preferably, the GaN layer 102b in the low refractive index layer 102 is adjacent to the high refractive index layer 103, and in the low refractive index layer 102, the GaN layer 102b located between the high refractive index layer 103 and the AlN layer 102a is thicker than the GaN layer 102b located between the two AlN layers 102a. This is because the effective refractive index difference can be larger. Regarding the film thickness of the GaN layer 102b, the film thickness of the GaN layer 102b located at an interface between the high refractive index layer 103 and the low refractive index layer 102, where distortion is changed from compressive distortion to tensile distortion or changed from tensile distortion to compressive distortion, is preferably 5 nm or more. This is because a reflector can be formed without largely impairing crystal quality. In this way, by setting the film thickness of the GaN layer 102b adjacent to the high refractive index layer 103 to 5 nm or more and setting the film thickness of the GaN layer 102b sandwiched between the MN layers 102a to 5 nm or less to bring the MN layer 102a closer to the central side of the low refractive index layer 102, it is possible to make the effective refractive index extremely large.

However, the film thickness of the GaN layer 102b in the low refractive index layer 102 is not limited to the above values, and the film thickness of each of the GaN layers 102b may be 5 nm or more. In this case, sufficient flatness can be obtained.

If the In composition of the InGaN layer included in the high refractive index layer 103 is more than 0.20, it may be impossible to obtain sufficient thermal conductivity. Therefore, the In composition of the InGaN layer is preferably less than 0.20, and more preferably less than 0.10 from a viewpoint of thermal conductivity. Meanwhile, if the In composition of the InGaN layer is less than 0.02, compressive distortion generated in the InGaN layer is small, and it may be impossible to sufficiently compensate distortion of the MN layer 102a. Therefore, the In composition of the InGaN layer is preferably 0.02 or more, and more preferably 0.03 or more from a viewpoint of distortion.

The high refractive index layer 103 may have a laminated structure in which an InGaN layer and a GaN layer are alternately laminated. By inclusion of the GaN layer in the high refractive index layer 103, better heat dissipation can be obtained. In this case, the In composition is preferably 0.02 or more and less than 0.20, and more preferably 0.03 or more and less than 0.10 from viewpoints of thermal conductivity and distortion in the entire high refractive index layer 103.

Next, a method for manufacturing the reflector 100 according to the first embodiment will be described. In this manufacturing method, the low refractive index layer 102 and the high refractive index layer 103 are epitaxially grown on the substrate 101 alternately. Examples of a method of epitaxial growth include a metal organic chemical vapor deposition (MOCVD) method, a molecular beam epitaxy (MBE) method, a plasma chemical vapor deposition (PCVD) method, and a hydride vapor phase epitaxy (HVPE) method.

Here, the MOCVD method will be described. As a raw material to be used, trimethylgallium (TMG), trimethylaluminum (TMA), trimethylindium (TMI), or the like is used as a group III raw material. Ammonia ($NH_3$) or the like is used as a nitrogen raw material. With regard to a conductivity controlling impurity, silane or disilane of a Si source, monogermane of a Ge source, or the like can be used as a donor impurity, and cyclopentadienyl magnesium of a Mg source or the like can be used as an acceptor impurity. Growth of each layer is controlled by opening/closing a valve of a group III raw material or an impurity raw material while supplying $NH_3$.

First, a substrate is set in a reactor of a manufacturing apparatus. Nitrogen and $NH_3$ are supplied into the reactor, and the temperature of the substrate is raised to about 800 to 1000° C. Thereafter, a group III raw material is supplied to alternately grow the low refractive index layer 102 and the high refractive index layer 103.

In this manner, the reflector 100 can be manufactured.

Note that the product $P_{AlN}$ of distortion of the MN layer and the total film thickness thereof and the product $P_{InGaN}$ of distortion of the InGaN layer and the total film thickness thereof can be adjusted, for example, with these film thicknesses.

As in a fifth embodiment described later, a buffer layer having conductivity may be formed on a substrate, and then the low refractive index layer 102 and the high refractive index layer 103 may be alternately grown on the buffer layer. By forming the buffer layer, better crystal quality can be obtained. In this case, the substrate on which the buffer layer is formed can be regarded as one substrate having conductivity.

A growth temperature of each of the low refractive index layer 102 and the high refractive index layer 103 is preferably kept constant. In a case where the growth temperature of each of the low refractive index layer 102 and the high refractive index layer 103 is changed, next growth cannot be performed until the temperature is stabilized after switching of the temperature, resulting in a decrease in productivity. In particular, the In composition of the InGaN layer is easily affected by temperature. Time for stabilization of temperature is, for example, about several minutes to several tens of minutes. Furthermore, during a period of interruption of growth, Si may be desorbed from a quartz member used for a reactor or a tray on which a substrate is placed, or in a case where the low refractive index layer 102 or the high refractive index layer 103 is doped with impurities in order to impart conductivity, the doped impurities may be concentrated on a surface. Concentration of impurities may cause defects at an interface between the low refractive index layer 102 and the high refractive index layer 103, which may lead to deterioration of crystallinity and a decrease in reflectance. From these facts, the growth temperature of each of the low refractive index layer 102 and the high refractive index layer 103 is preferably kept constant.

The growth temperature of each of the low refractive index layer 102 and the high refractive index layer 103 is preferably 700° C. or higher and lower than 1000° C. If the growth temperature is lower than 700° C., it may be impossible to obtain excellent crystallinity. Meanwhile, if the growth temperature is 1000° C. or higher, In is hardly incorporated into the InGaN layer, and formation of the InGaN layer may be difficult. Therefore, the growth temperature of each of the low refractive index layer 102 and the high refractive index layer 103 is preferably 700° C. or higher and lower than 1000° C. Furthermore, if the GaN layer is grown at a temperature around 900° C., excellent flatness is easily obtained. Therefore, the growth temperature of each of the low refractive index layer 102 and the high refractive index layer 103 is preferably 800° C. or higher and lower than 950° C.

The InGaN layer is grown in a nitrogen atmosphere. Even if it is attempted to grow the InGaN layer in a hydrogen atmosphere, In cannot be incorporated into a layer at all. The MN layer and the GaN layer may be grown in either a nitrogen atmosphere or a hydrogen atmosphere, but is preferably grown in a nitrogen atmosphere. In a case where the MN layer and the GaN layer are grown in a hydrogen atmosphere, when the atmosphere is switched from a nitrogen atmosphere for growing the InGaN layer to the hydrogen atmosphere, In may be desorbed from a surface of the InGaN layer. When the low refractive index layer 102 is grown, a first pair of the MN layer 102a and the first GaN layer 102b may be grown in a nitrogen atmosphere and the remaining layers may be grown in a hydrogen atmosphere.

A VIII ratio at the time of growing the low refractive index layer 102 and the high refractive index layer 103 is preferably 1000 or more. This is for suppressing desorption of nitrogen from the GaN layer and the InGaN layer to obtain excellent crystal quality. If the MN layer is grown at a VIII ratio of 1000 or more, the supply amount of Al to a substrate surface is decreased due to an irreversible reaction of a raw material in a gas phase, and a growth rate is slightly lowered. However, the GaN layer and the InGaN layer can be grown at a high speed, and therefore good productivity can be obtained for the entire reflector 100.

The crystal quality of the MN layer is less affected by the VIII ratio than the GaN layer or the InGaN layer. Furthermore, time required to follow a change in the supply amount of $NH_3$ is about several seconds, which is about the same as response time of a mass flow controller. Therefore, the VIII ratio at the time of growth of the AlN layer may be lower than that at the time of growth of the GaN layer and the InGaN layer. By lowering the VIII ratio at the time of growth of the MN layer, it is possible to suppress a parasitic reaction, to improve the growth rate, and to further improve productivity. Since time during which the growth is interrupted due to the change in the gas supply amount is short, mixing of impurities into an interface between layers of the reflector 100 can also be suppressed. The VIII ratio at the time of growth of the MN layer is preferably 10 or more and less than 1000.

In particular, in a case where the low refractive index layer 102 and the high refractive index layer 103 are doped with impurities of about $1 \times 10^{18}$ cm$^{-3}$, an impurity concentration at an interface can be suppressed to $1 \times 10^{21}$ cm$^{-3}$ or less. In a case where the low refractive index layer 102 and the high refractive index layer 103 are undoped with impurities, the impurity concentration can be suppressed to $1 \times 10^{17}$ cm$^{-3}$ or less. "Undoped" here means that a layer is not intentionally doped with impurities, and the residual impurity concentration in a crystal is $1 \times 10^{17}$ cm$^{-3}$ or less.

According to such a method, one pair (one cycle) of the low refractive index layer 102 and the high refractive index layer 103 can be grown in about five minutes although depending on gas conditions, and the reflector 100 including 50 to 60 cycles of the low refractive index layers 102 and the high refractive index layers 103 can be manufactured in about four to five hours.

Incidentally, in a case where an AlGaN layer is used for the low refractive index layer, in addition to the above disadvantage of the heat dissipation, there is also a disadvantage related to a manufacturing process as described below.

First, TMA used as an Al raw material of the AlGaN layer may cause an irreversible parasitic reaction not contributing to growth with $NH_3$ used as a nitrogen raw material in a vapor phase. The AlGaN layer is preferably grown at a high VIII ratio of about 1000 to 10000 in order to suppress desorption of nitrogen to obtain good crystal quality. However, a parasitic reaction tends to occur significantly at such a high VIII ratio, and the Al composition in a solid phase may decrease, or the growth rate may decrease. The AlGaN layer is grown while Al is incorporated into the GaN layer. However, if conditions that easily suppress the parasitic reaction are adopted, for example, when the VIII ratio is lowered, nitrogen desorption or the like occurs to cause defects, and the crystal quality tends to deteriorate.

Secondly, a particularly preferable growth temperature of the InGaN layer used for the high refractive index layer is about 700 to 900° C., whereas a preferable growth temperature of the AlGaN layer is about 1000 to 1100° C. In a case where the InGaN layer and the AlGaN layer are grown at different temperatures, at some growth temperatures of the AlGaN layer, thermal decomposition may occur in the InGaN layer while the temperature is rising after formation of the InGaN layer. It is necessary to interrupt the growth for several minutes to several tens of minutes before the temperature of the reactor is stabilized after the temperature rises and falls. In particular, the In composition of the InGaN layer is sensitive to the temperature of the reactor, and therefore it takes at least 10 minutes for stabilization of the temperature after the temperature falls. Growth interruption may cause mixing of impurities into an interface between the AlGaN layer and the InGaN layer together with a decrease in productivity.

If the InGaN layer and the AlGaN layer are grown at different temperatures, if the sum of time required for temperature rise and time required for stabilization after the temperature rise is estimated to be 5 minutes and the sum of time required for temperature fall and time required for stabilization after the temperature fall is estimated to be 15 minutes, it is calculated that it takes about 17 to 20 hours as compared with the above manufacturing method according to the present embodiment.

In a case where the InGaN layer and the AlGaN layer are grown at a constant temperature, growth is performed at a temperature suitable for the InGaN layer from a viewpoint of suppressing thermal decomposition of the InGaN layer. In this case, decomposition efficiency of $NH_3$ is lower than that in a case where the growth temperature is 1000 to 1100° C., and the effective V/III ratio is lowered. Therefore, defects are easily generated in the AlGaN layer. If the supply amount of $NH_3$ is increased to raise the V/III ratio, as described above, a parasitic reaction easily occurs, and it is difficult to grow an AlGaN layer having a high Al composition suitable for a high reflectance.

It is conceivable to include an AlInN layer in the reflector. However, the AlInN layer also has a disadvantage related to a manufacturing process like the AlGaN layer.

Here, a specific example of the first embodiment will be described.

This specific example is based on an application in which a reflection wavelength is 405 nm. The low refractive index layer 102 includes two AlN layers 102a and three GaN layers 102b, and the film thickness of each of the AlN layers 102a and the GaN layers 102b is 6 nm. The high refractive index layer 103 includes an $In_{0.05}Ga_{0.95}N$ layer having a film thickness of 50 nm. The low refractive index layer 102 and the high refractive index layer 103 are alternately laminated on the GaN substrate 101 for 46 cycles in total. In a case where a reflection wavelength λ is 405 nm, the refractive index of GaN is 2.54, the refractive index of AlN is 2.12, and the refractive index of $In_{0.05}Ga_{0.95}N$ is 2.61. Therefore, the optical film thickness of the low refractive index layer 102 is 71.16 nm, the optical film thickness of the high refractive index layer 103 is 130.5 nm, the optical film thickness of the low refractive index layer 102 is about 30% thinner than λ/4 (=101.25 nm), and the optical film thickness of the high refractive index layer 103 is about 30% thicker than λ/4. In this case, the product $P_{AlN}$ of distortion of the AlN layer 102a and the film thickness thereof is 1.06 times the product $P_{InGaN}$ of distortion of the InGaN layer (high refractive index layer 103) and the film thickness thereof, and the deformation amount of the AlN layer 102a is substantially equal to the deformation amount of the InGaN layer (The high refractive index layer 103).

In manufacturing the reflector in this specific example, first, the GaN substrate 101 is set in a reactor of a MOCVD apparatus and heated. The temperature of the substrate 101 is heated to 850° C. to grow a laminated structure of the AlN layer 102a having a thickness of 6 nm and the GaN layer 102b having a thickness of 6 nm as the low refractive index layer 102. At this time, the GaN layer 102b is grown first, and the GaN layer 102b and the AlN layer 102a are grown for 2.5 cycles in total. As gas conditions of the AlN layer 102a, a nitrogen atmosphere is used, the supply amount of TMA is 80 μmol/min, the supply amount of NH$_3$ is mmol/min, and the VIII ratio is 500. As gas conditions of the GaN layer 102b, a nitrogen atmosphere is used, the supply amount of TMG is 100 μmol/min, the supply amount of NH$_3$ is 200 mmol/min, and the V/III ratio is 2000. The supply amount of NH$_3$ is different between the growth of the GaN layer 102b and the growth of the AlN layer 102a. Therefore, growth is interrupted for 5 seconds as a stabilization waiting time of the NH$_3$ gas supply amount.

After growth of the low refractive index layer 102, an In$_{0.05}$Ga$_{0.95}$N layer having a thickness of 50 nm is grown as the high refractive index layer 103 while the temperature of the substrate 101 is kept at 850° C. As gas conditions of the InGaN layer, a nitrogen atmosphere is used, the supply amount of TMG is 100 μmol/min, the supply amount of TMI is 70 μmol/min, the supply amount of NH$_3$ is 200 mmol/min, and the VIII ratio is 1176. The supply amounts of TMG and NH$_3$ are the same as those at the time of growth of GaN immediately before the growth of the InGaN layer. Therefore, growth is not interrupted but continued.

Thereafter, the growth of the laminated structure of the AlN layer 102a and the GaN layer 102b and the growth of the InGaN layer are alternately repeated 46 times in total.

In this way, the reflector 100 having a reflectance of 99.9% and a reflection wavelength of 405 nm is obtained.

Second Embodiment

Figure 2:
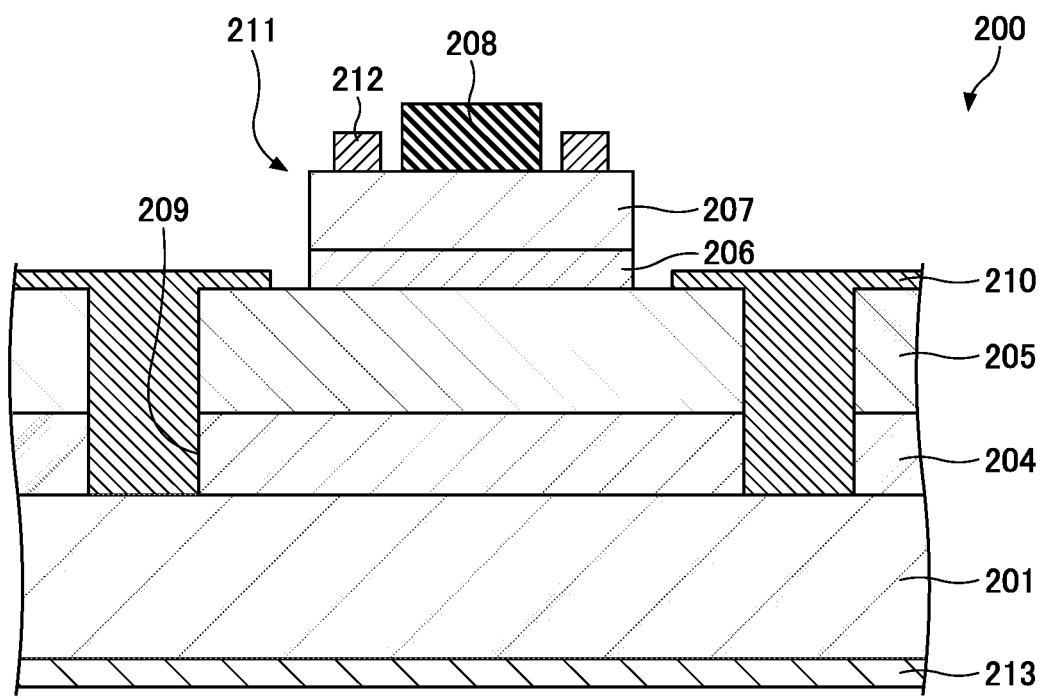
FIG. 2 is a cross-sectional view illustrating a surface emitting laser according to a second embodiment.

Next, a second embodiment will be described. The second embodiment relates to a surface emitting laser. FIG. 2 is a cross-sectional view illustrating the surface emitting laser according to the second embodiment.

As illustrated in FIG. 2, a surface emitting laser 200 according to the second embodiment includes a substrate 201 having conductivity and including GaN, a first reflector 204 on the substrate 201, and a first conductivity type first spacer layer (first semiconductor layer) 205 on the first reflector 204. The surface emitting laser 200 further includes an active layer 206 on the first spacer layer 205, a second conductivity type second spacer layer (second semiconductor layer) 207 on the active layer 206, and a second reflector 208 on the second spacer layer 207. The first reflector 204 includes the reflector 100 according to the first embodiment. The laminated structure of the active layer 206 and the second spacer layer 207 has a mesa structure 211. An opening 209 is formed in the first reflector 204 and the first spacer layer 205, and a conductive portion 210 is disposed in the opening 209. That is, the surface emitting laser 200 includes the conductive portion 210 for electrically coupling the substrate 201 to the first spacer layer 205 in the opening 209. The surface emitting laser 200 further includes an upper electrode 212 on a surface of the second spacer layer 207 and a lower electrode 213 on a back surface of the substrate 201.

The substrate 201 is, for example, a GaN substrate. The first spacer layer 205 is a first conductivity type semiconductor layer, for example, a GaN layer, an AlGaN layer, or an InGaN layer. The first conductivity type may be either n-type or p-type, but is preferably n-type from a viewpoint of resistivity. For example, the n-type semiconductor layer contains Si, Ge, and the like as impurities, and the p-type semiconductor layer contains Mg and the like.

The active layer 206 has a multi-quantum well structure such as InGaN/GaN or InGaN/InGaN, for example. Such a multi-quantum well structure efficiently confines carriers injected from the first spacer layer 205 and the second spacer layer 207 and is suitable for obtaining excellent luminous efficiency.

The second spacer layer 207 is a second conductivity type semiconductor layer, for example, a GaN layer, an AlGaN layer, or an InGaN layer. If the first conductivity type is n type, the second conductivity type is p type. If the first conductivity type is p type, the second conductivity type is n type. For example, the p-type semiconductor layer contains Mg and the like, and the n-type semiconductor layer contains Si, Ge, and the like as impurities.

The laminated structure of the active layer 206 and the second spacer layer 207 has the mesa structure 211. This is for element isolation.

A material of the conductive portion 210 is, for example, a conductive semiconductor or a metal. In a case where a conductive semiconductor is used, the conductivity type of the conductive portion 210 is the same as the conductivity type of the first spacer layer 205, and a material thereof is, for example, GaN, AlGaN, or InGaN. In a case where a metal is used, a material capable of forming ohmic contact with the substrate 201 and the first spacer layer 205 is used, and examples thereof include Ti/Al and Cr/Au. The substrate 201 does not need to be physically in direct contact with the conductive portion 210, and a buffer layer (third semiconductor layer) doped with impurities of $1 \times 10^{18}$ cm$^{-3}$ or more may be disposed therebetween. Such a buffer layer contributes to reducing a contact resistance between the substrate 201 and the conductive portion 210. The substrate 201 on which the buffer layer is formed can be regarded as one substrate having a conductive layer.

The second reflector 208 is, for example, a multilayer film reflector using a semiconductor, a dielectric, or a combination thereof. The reflector 100 may be used for the second reflector 208. In a case where the reflector 100 is used, heat generated in the active layer 206 can also be released with high efficiency from the second reflector 208. The second reflector 208 may have a laminated structure in which an AlInN layer and a GaN layer are alternately laminated. The second reflector 208 may be a multilayer film reflector using another semiconductor material. Examples of the dielectric include SiN, SiO$_2$, Ta$_2$O$_5$, and Nb$_2$O$_5$.

The reflectance of the second reflector 208 can be adjusted as follows. For example, by properly determining the film thicknesses of the low refractive index layer and the high refractive index layer constituting the second reflector 208, a reflectance can be adjusted. For example, by properly determining the film thicknesses of a Ta$_2$O$_5$ layer and a SiO$_2$ layer, a reflectance can be adjusted. By properly combining a plurality of sets of laminates having different refractive index differences, a reflectance can be adjusted. For example, by combining at least one of a first laminate in which a SiN layer and a SiO$_2$ layer are alternately laminated and a second laminate in which a Ta$_2$O$_5$ layer and a SiO$_2$ layer are alternately laminated at a proper number of cycles, a reflectance can be adjusted. By adding a layer having a different average refractive index from the low refractive index layer and the high refractive index layer, a reflectance can be adjusted.

By setting the reflectance of the second reflector 208 to be lower than the reflectance of the first reflector 204, light can be extracted from a side of the second reflector 208.

The heat dissipation of a dielectric is lower than the heat dissipation of a semiconductor. However, even if the dielectric is used for the second reflector 208, the heat dissipation of the first reflector 204 is excellent, and therefore heat generated in the active layer 206 is released through the substrate 201 with high efficiency.

A material capable of forming an ohmic contact with a semiconductor is used for the upper electrode 212 and the lower electrode 213. In a case of contact with p-GaN, Ni/Au is preferable. In a case of contact with n-GaN, Ti/Al is preferable. However, the present invention is not limited thereto.

The surface emitting laser 200 has the first reflector 204 having excellent heat dissipation on a side of the substrate 201 of the active layer 206. Therefore, a structure to extract light from a side of the second reflector 208 has a large advantage. For example, in a case where the surface emitting lasers 200 are integrated in a two-dimensional array and the lasers are individually operated in the plane, a circuit for individually driving the surface emitting lasers 200 is formed on a side of the upper electrode 212. In a junction-down structure in which light is extracted from a back side of the substrate 201 and heat is released to a side of the second reflector 208, it is necessary to form an electrode pattern for a driving circuit also in a package to be mounted, leading to an increase in cost. Meanwhile, in a junction-up structure in which light is extracted from a side of the second reflector 208 and heat is released from a side of the substrate 201, a circuit is unnecessary on a side of a package, and only by forming a wire on a circuit for individual operation formed on the upper electrode 212, cost can be lowered.

The AlN layer 102a having a high electric resistance is included in the first reflector 204. However, in the present embodiment, the substrate 201 is electrically coupled to the first spacer layer 205 through the conductive portion 210. Therefore, carriers can be injected from a side of substrate 201 to the active layer 206 through the first spacer layer 205. Note that it is difficult to sufficiently lower the resistance of AlN even if AlN is doped with impurities such as Si.

If the film thickness of the first spacer layer 205 is less than 1 μm, the resistance of the first spacer layer 205 is high, and carrier injection from the conductive portion 210 to the active layer 206 may be hindered. Therefore, the film thickness of the first spacer layer 205 is preferably 1 μm or more. Meanwhile, if the film thickness of the first spacer layer 205 is more than 2 μm, a resonator including the first spacer layer 205 is excessively long, and a diffraction loss of light may be large. Therefore, the film thickness of the first spacer layer 205 is preferably 2 μm or less.

Incidentally, in FIG. 2, the entire opening 209 is filled with the conductive portion 210. However, if the first spacer layer 205 is sufficiently electrically coupled to the substrate 201, the entire opening 209 does not need to be filled with the conductive portion 210.

Figure 3A:
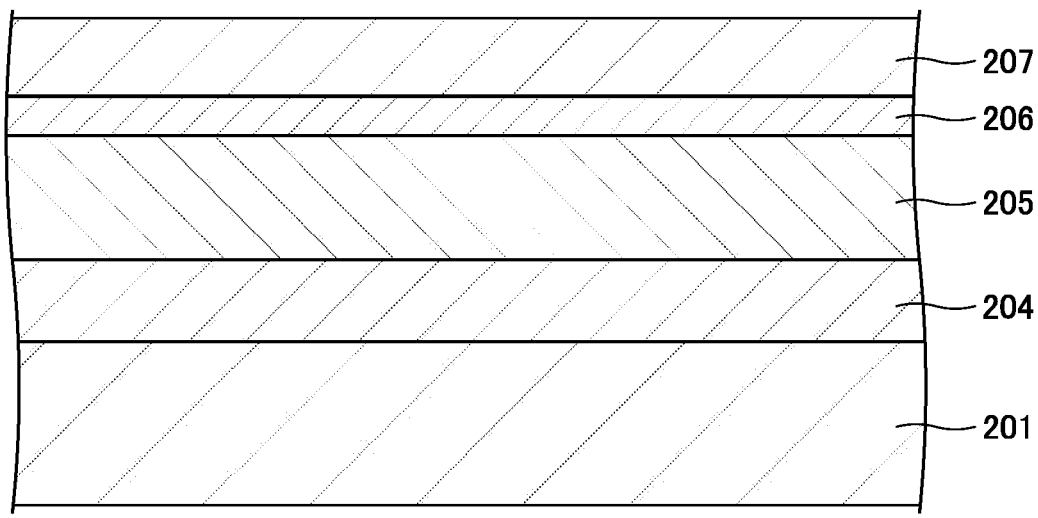
FIG. 3A is a cross-sectional view illustrating a method for manufacturing the surface emitting laser according to the second embodiment.
Figure 3B:
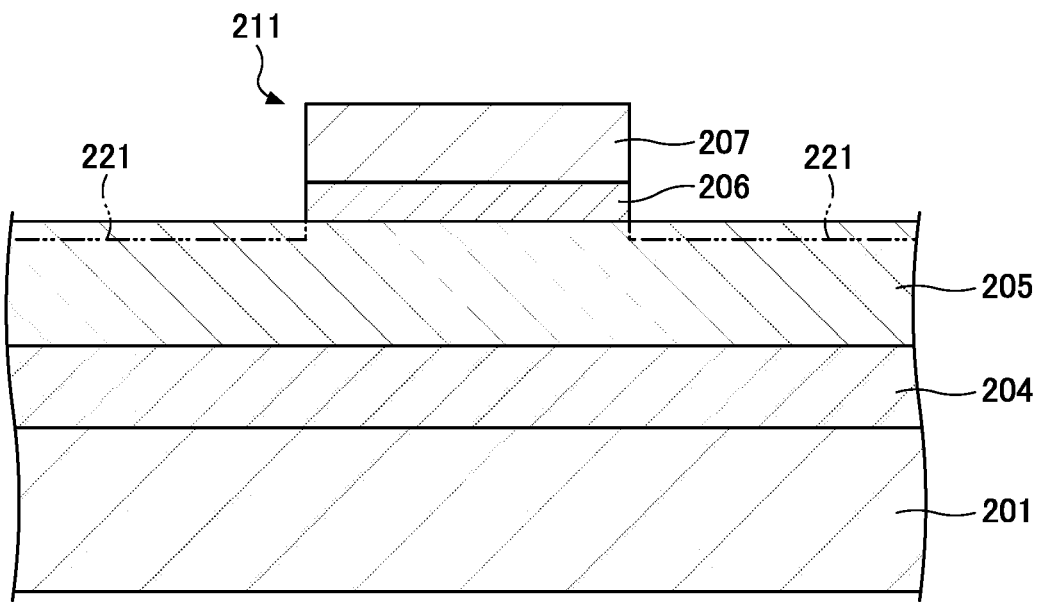
FIG. 3B is a cross-sectional view illustrating a method for manufacturing the surface emitting laser according to the second embodiment.
Figure 3C:
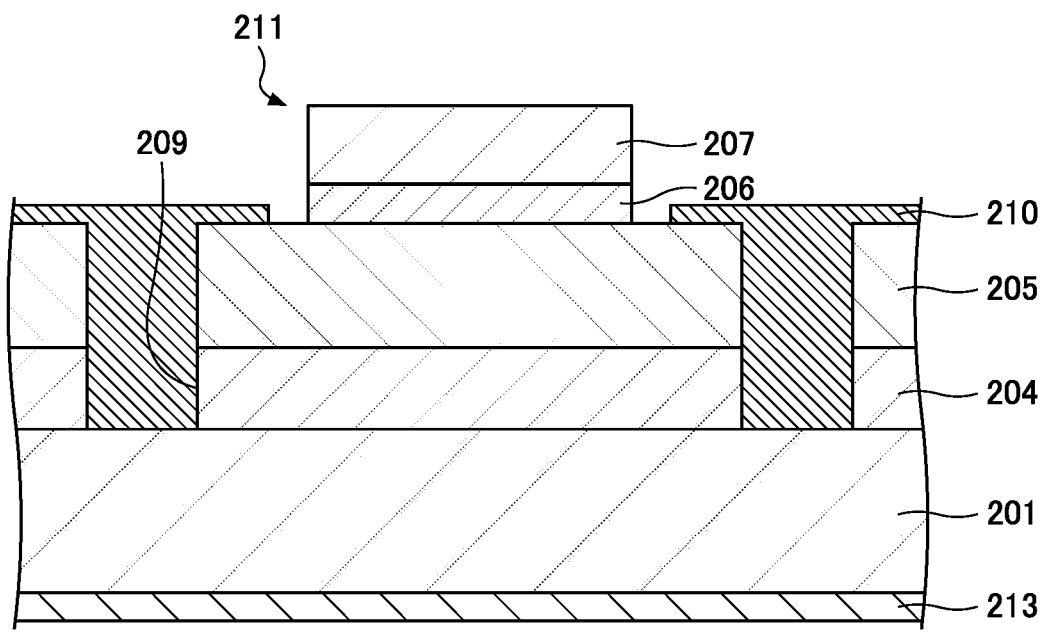
FIG. 3C is a cross-sectional view illustrating a method for manufacturing the surface emitting laser according to the second embodiment.

Next, a method for manufacturing the surface emitting laser 200 according to the second embodiment will be described. FIGS. 3A to 3C are cross-sectional views illustrating a method for manufacturing the surface emitting laser 200 according to the second embodiment in order of steps.

First, as illustrated in FIG. 3A, the first reflector 204 is grown on the substrate 201 by a MOCVD method. As the first reflector 204, the reflector 100 according to the first embodiment is formed. Subsequently, the first spacer layer 205, the active layer 206, and the second spacer layer 207 are sequentially grown on the first reflector 204 by a MOCVD method. These compound semiconductor layers may be grown by an MBE method, a PCVD method, an HYPE method, or the like.

Subsequently, as illustrated in FIG. 3B, the second spacer layer 207 and the active layer 206 are etched using lithography and dry etching to form the mesa structure 211. It is difficult to strictly stop etching the active layer 206 on a surface of the first spacer layer 205. Therefore, the surface of the first spacer layer 205 may be slightly etched to form a recess 221. Examples of lithography include photolithography, electron beam lithography, and nanoimprinting. Examples of dry etching include reactive ion etching (RIE).

Subsequently, as illustrated in FIG. 3C, the opening 209 is formed in the first spacer layer 205 and the first reflector 204. The opening 209 can be formed by etching the first spacer layer 205 and the first reflector 204 in a manner similar to formation of the mesa structure 211. Subsequently, the conductive portion 210 is formed in the opening 209. In a case where a metal material is used for the conductive portion 210, for example, at least the mesa structure 211 is covered, a resist pattern is formed so as to open a portion where the conductive portion 210 is to be formed, then a metal film is formed using a vapor deposition method, a sputtering method, a plating method, or the like, and the resist pattern is removed and lifted off. In a case where a semiconductor material is used for the conductive portion 210, for example, at least the mesa structure 211 is covered, a mask to hinder growth of the semiconductor is formed so as to open a portion where the conductive portion 210 is to be formed, and a semiconductor film is grown in a portion where the mask is not formed by a crystal growth method. As a result, a crystal grows from a side wall of the opening 209 with the first spacer layer 205 and the first reflector 204, and finally, the conductive portion 210 formed of a nitride semiconductor is formed between the substrate 201 and the first spacer layer 205. Examples of a material of the mask include SiO$_2$ and SiN.

After the conductive portion 210 is formed, the upper electrode 212 is formed on a surface of the second spacer layer 207, and the lower electrode 213 is formed on a back surface of the substrate 201. Subsequently, the second reflector 208 is formed on the second spacer layer 207.

In this manner, the surface emitting laser 200 according to the second embodiment can be manufactured.

According to this manufacturing method, the first reflector 204 having excellent heat dissipation can be manufactured with excellent productivity. Therefore, the surface emitting laser 200 having excellent heat dissipation can be manufactured with excellent productivity.

Incidentally, in a case where a semiconductor material is used for the second reflector 208, the layer of the second reflector 208 may be grown subsequent to the second spacer layer 207 before the mesa structure 211 is formed. In this case, the compound semiconductor layer can be continuously formed, and therefore productivity can be improved. The formation order of the opening 209, the conductive portion 210, the upper electrode 212, the lower electrode 213, and the like may be appropriately changed.

Third Embodiment

Figure 4:
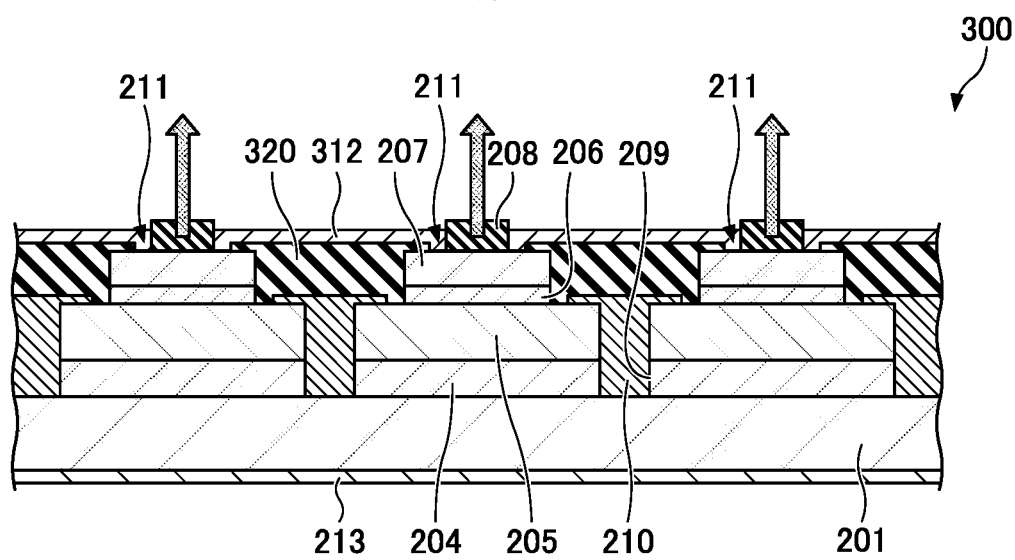
FIG. 4 is a cross-sectional view illustrating a two-dimensional array light source according to a third embodiment.

Next, a third embodiment will be described. The third embodiment relates to a two-dimensional array light source. The two-dimensional light source array is an example of a surface emitting laser. FIG. 4 is a cross-sectional view illustrating the two-dimensional array light source according to the third embodiment.

A two-dimensional array light source 300 according to the third embodiment has a structure in which a plurality of surface emitting lasers similar to the surface emitting laser 200 is arranged in a plane. However, in the second embodiment, one upper electrode 212 is disposed for one surface emitting laser 200, whereas in the third embodiment, an upper common electrode 312 common to the plurality of surface emitting lasers is disposed. That is, one upper common electrode 312 is electrically coupled to a plurality of second spacer layers 207. An insulating layer 320 electrically insulating the upper common electrode 312 from a first spacer layer 205 and a conductive portion 210 is disposed. The insulating layer 320 covers the first spacer layer 205 and the conductive portion 210 and also covers a side wall of a mesa structure 211. Examples of a material of the insulating layer 320 include an inorganic material such as $SiO_2$ or SiN and an organic material such as polyimide.

In the two-dimensional array light source 300 according to the third embodiment, by applying a voltage between the upper common electrode 312 and a lower electrode 213, carriers are injected into each of the surface emitting lasers, and each of the surface emitting lasers emits light.

Here, an example of a layout of the surface emitting laser constituting the two-dimensional array light source will be described. FIGS. 5A to 5D are diagrams illustrating examples of the layout of the two-dimensional array light source. Here, the layout of each of the mesa structure 211 and an opening 209 will be described.

Figure 5A:
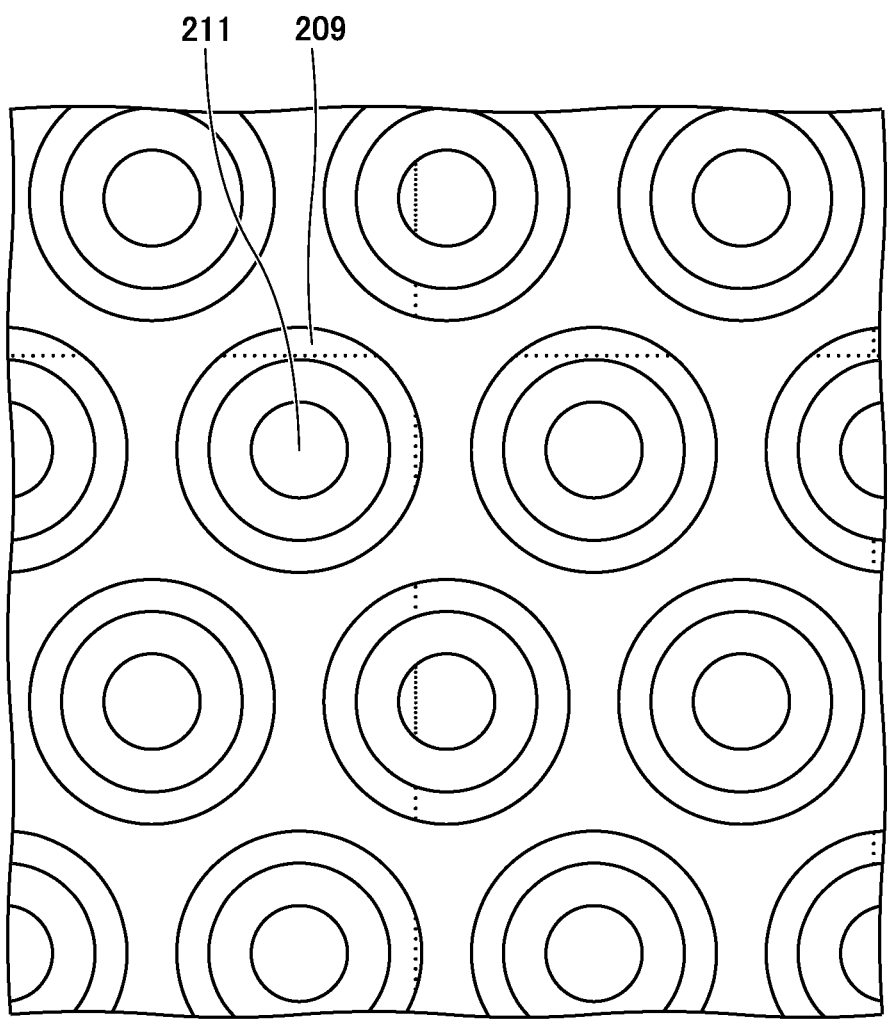
FIG. 5A is a diagram illustrating an example of a layout of a two-dimensional array light source.

In the example illustrated in FIG. 5A, the mesa structures 211 are arranged in an equilateral triangular lattice shape, and the opening 209 is formed independently for each of the mesa structures 211. That is, each of the mesa structures 211 is surrounded by one opening 209.

Figure 5B:
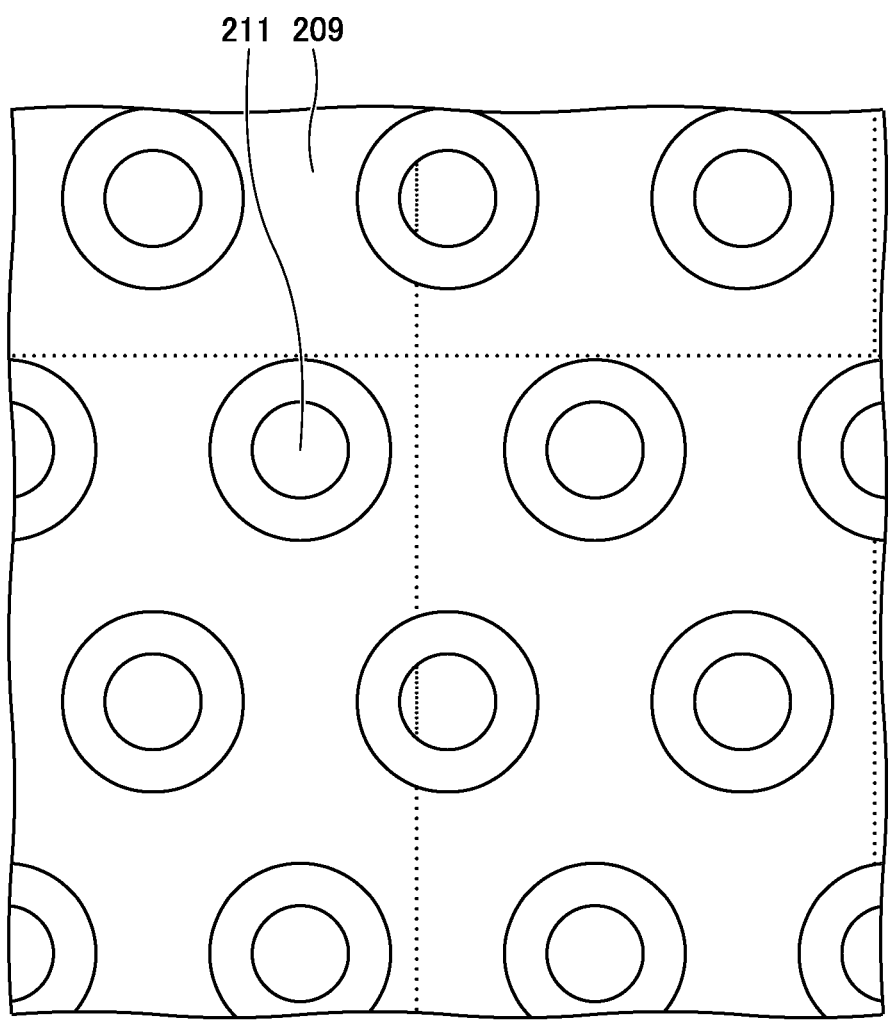
FIG. 5B is a diagram illustrating an example of a layout of a two-dimensional array light source.

In the example illustrated in FIG. 5B, the mesa structures 211 are arranged in an equilateral triangular lattice shape, and a single opening 209 is formed around the plurality of mesa structures 211. That is, the opening 209 is shared by the plurality of surface emitting lasers.

Figure 5C:
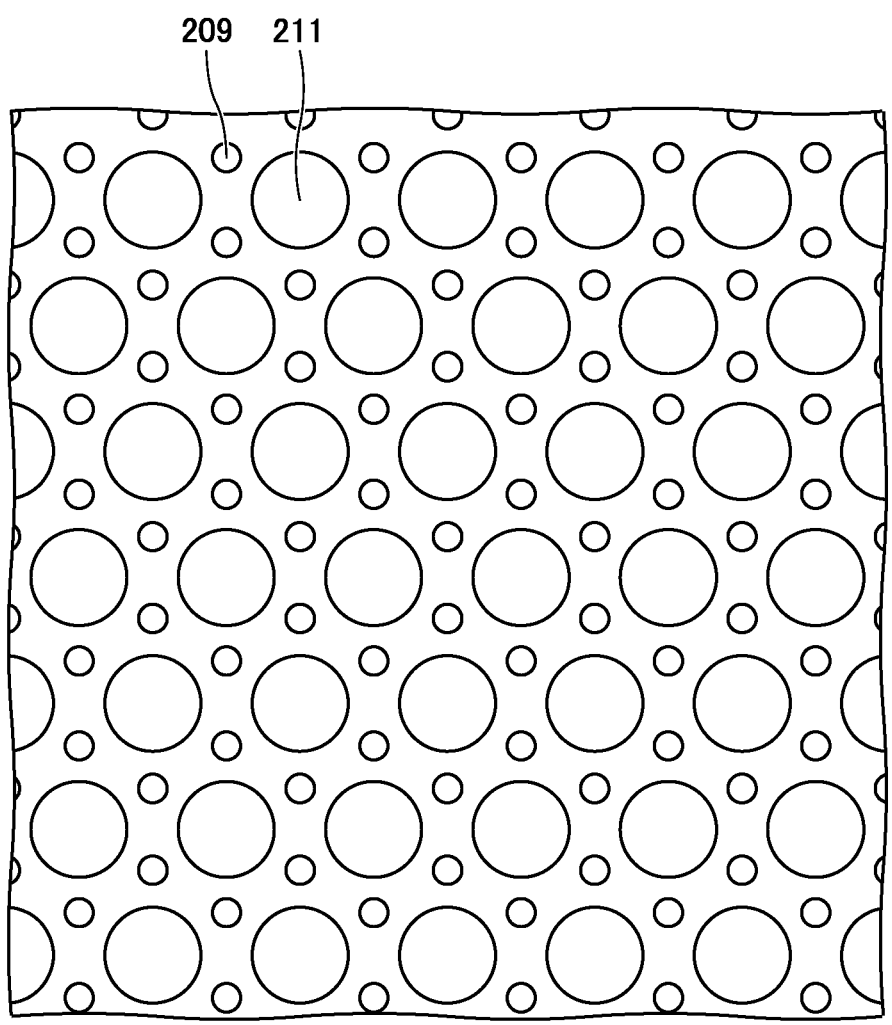
FIG. 5C is a diagram illustrating an example of a layout of a two-dimensional array light source.

In the example illustrated in FIG. 5C, a plurality of (here, six) openings 209 is formed around one mesa structure 211, and the openings 209 are shared by adjacent mesa structures 211. That is, the mesa structures 211 are arranged in an equilateral triangular lattice shape, and one opening 209 is formed in the center of gravity of adjacent mesa structure 211 forming lattice points. The example illustrated in FIG. 5C is a structure capable of increasing the density of the surface emitting laser as compared with the examples illustrated in FIGS. 5A and 5B.

Figure 5D:
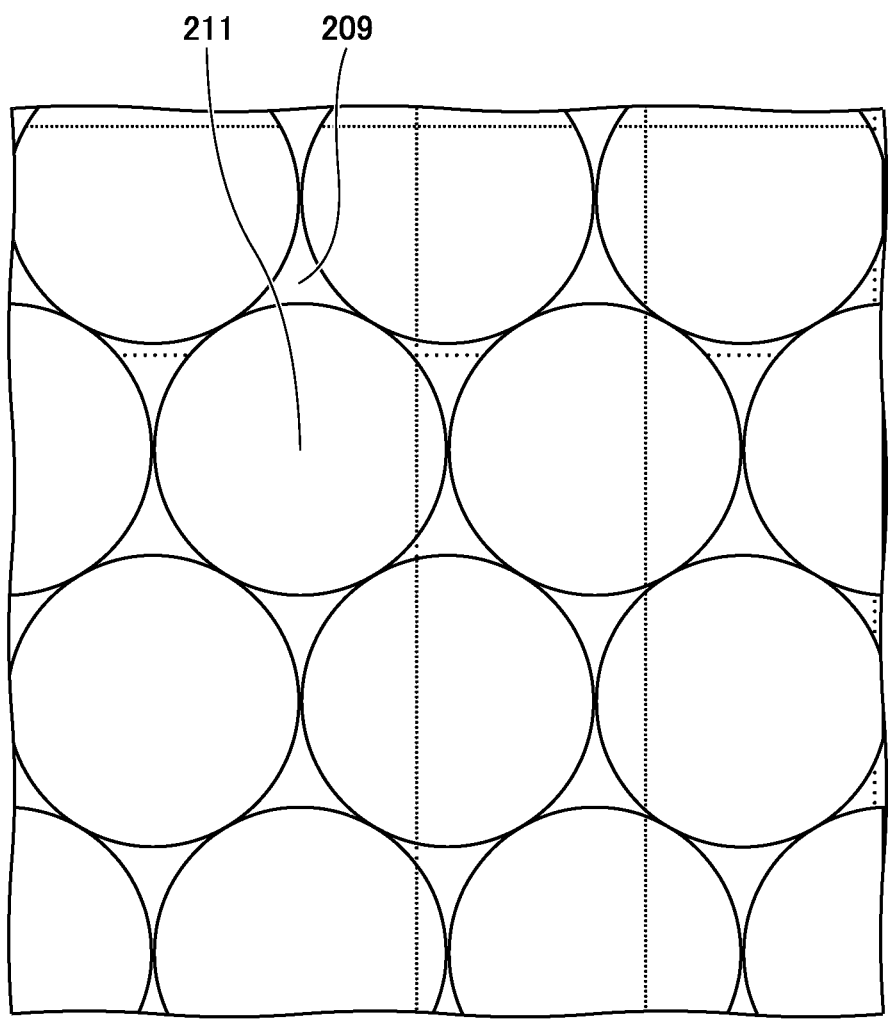
FIG. 5D is a diagram illustrating an example of a layout of a two-dimensional array light source.

The example illustrated in FIG. 5D is an example in which the mesa structures 211 are adjacent to each other in the example illustrated in FIG. 5C, and can arrange the surface emitting lasers at a higher density. The entire region surrounded by the mesa structures 211 can be the opening 209.

Incidentally, in the examples illustrated in FIGS. 5A to 5D, the planar shape of the mesa structure 211 is a circle, and in the examples illustrated in FIGS. 5A to 5C, the planar shape of the opening 209 is a circle. However, the planar shape thereof may be a polygon such as a quadrangle or a triangle, or may be a circle or a shape other than a polygon. As the arrangement of the mesa structures 211, an equilateral triangular lattice shape has been exemplified. However, the mesa structures 211 may be arranged in another form such as a rectangular lattice shape.

Fourth Embodiment

Figure 6:
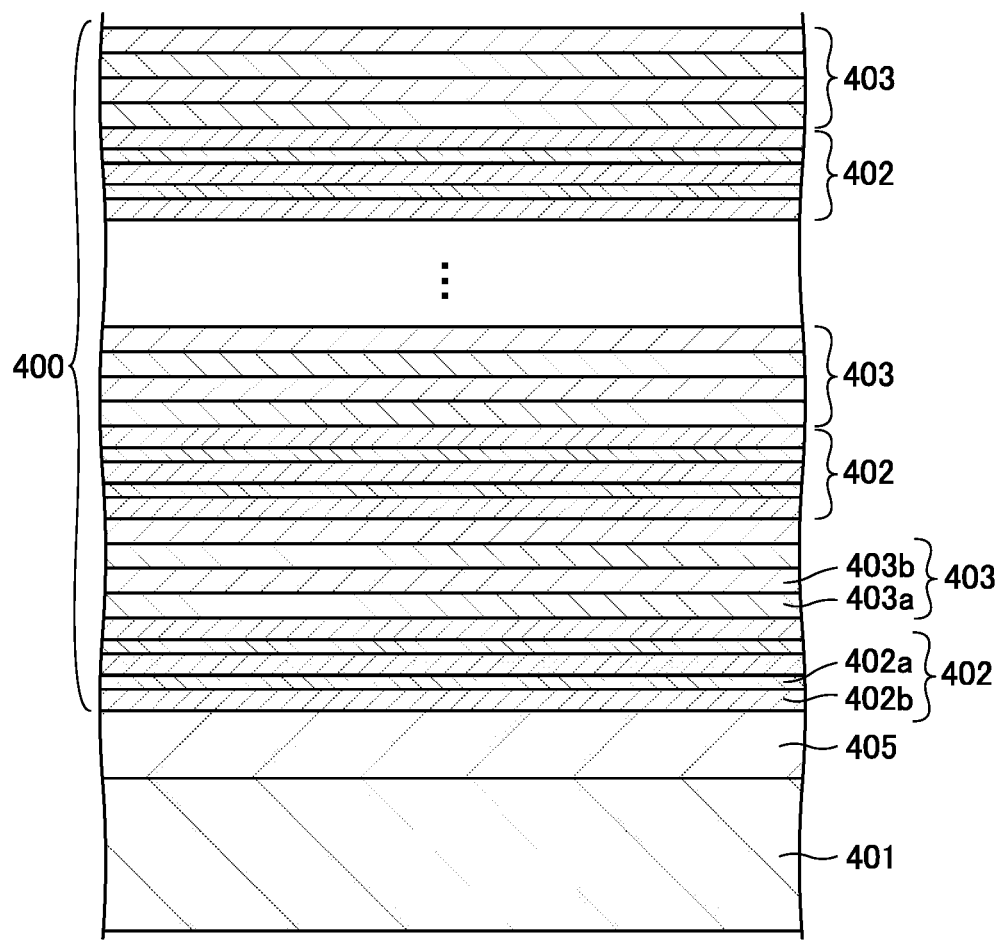
FIG. 6 is a cross-sectional view illustrating a reflector according to a fourth embodiment.

Next, a fourth embodiment will be described. The fourth embodiment relates to a reflector. FIG. 6 is a cross-sectional view illustrating the reflector according to the fourth embodiment.

As illustrated in FIG. 6, in a reflector 400 according to the fourth embodiment, a low refractive index layer 402 having a laminated structure in which an MN layer 402a and a GaN layer 402b are alternately laminated, and a high refractive index layer 403 having a laminated structure in which an $In_{0.10}Ga_{0.90}N$ layer 403a and a GaN layer 403b are alternately laminated are alternately laminated. An average refractive index (an example of a first average refractive index) of the low refractive index layer 402 is smaller than an average refractive index (an example of a second average refractive index) of the high refractive index layer 403. The average refractive index of the low refractive index layer 402 is a value obtained by dividing the sum of a product of the optical film thickness and the refractive index of each layer included in the low refractive index layer 402 by the total optical film thickness of the low refractive index layer 402. Similarly, the average refractive index of the high refractive index layer 403 is a value obtained by dividing the sum of a product of the optical film thickness and the refractive index of each layer included in the high refractive index layer 403 by the total optical film thickness of the high refractive index layer 403.

The reflector 400 is used by being disposed on a buffer layer 405 including GaN, for example, formed on a substrate 401. For example, a material of the buffer layer 405 has a lattice constant of GaN. A material of the substrate 401 also has a lattice constant of GaN. As the substrate 401, a GaN substrate or a GaN template in which a GaN layer is grown on a heterogeneous substrate can be used. Examples of the heterogeneous substrate include a sapphire substrate, a Si substrate, a GaAs substrate, and a SiC substrate.

According to the reflector 400, it is possible to achieve an extremely high reflectance, for example, a reflectance of 99.9% or more by a proper combination of the low refractive index layer 402 and the high refractive index layer 403. Since the thermal conductivity of each of the AlN layer 402a and the GaN layer 402b is higher than the thermal conductivity of AlGaN, heat dissipation can be improved. Furthermore, since the high refractive index layer 403 includes the GaN layer 403b, better heat dissipation can be obtained.

Here, a specific example of the fourth embodiment will be described.

This specific example is based on an application in which a reflection wavelength λ is 450 nm. The low refractive index layer 402 includes two AlN layers 402a and three GaN layers 402b, the film thickness of the AlN layer 402a is 5 nm, and the film thickness of the GaN layer 402b is 14 nm. The high refractive index layer 403 includes two $In_{0.10}Ga_{0.90}N$ layers 403a and two GaN layers 403b, and the film thickness of each of the $In_{0.10}Ga_{0.90}N$ layer 403a and the GaN layer 403b is 10 nm. The low refractive index layers 402 and the high refractive index layers 403 are alternately laminated for 73 cycles of in total on the GaN substrate 401 through the GaN buffer layer 405 having a thickness of 2 μm. In a case where the reflection wavelength λ is 450 nm, the refractive index of GaN is 2.46, the refractive index of AlN is 2.20, and the refractive index of $In_{0.10}Ga_{0.90}N$ is 2.60. Therefore, the optical film thickness of the low refractive index layer 402 is 125.32 nm, the optical film thickness of the high refractive index layer 403 is 101.2 nm, the optical film thickness of the low refractive index layer 402 is about 10% thinner than λ/4 (=112.5 nm), and the optical film thickness of the high refractive index layer 403 is about 10% thicker than λ/4. In this case, a product $P_{AlN}$ of distortion of the AlN layer 402a and the film thickness thereof is 1.11 times a product $P_{InGaN}$ of distortion of the $In_{0.10}Ga_{0.90}N$ layer 403a and the film thickness thereof, and the deformation amount of the AlN layer 402a is substantially equal to the deformation amount of the $In_{0.10}Ga_{0.90}N$ layer 403a.

In manufacturing the reflector in this specific example, first, a GaN substrate is set in a reactor of a MOCVD apparatus as the substrate 401 and heated. The temperature of the substrate 401 is heated to 1100° C., and a GaN layer having a film thickness of 2 μm is grown on the substrate 401 as the buffer layer 405 for improving crystal quality. Subsequently, the temperature of the substrate 401 is lowered to 800° C., and a laminated structure of the AlN layer 402a having a thickness of 5 nm and the GaN layer 402b having a thickness of 14 nm is grown as the low refractive index layer 402. At this time, the GaN layer 402b is grown first, and the GaN layer 402b and the MN layer 402a are grown for 2.5 cycles in total. As gas conditions of the AlN layer 402a, a nitrogen atmosphere is used, the supply amount of TMA is 80 μmol/min, the supply amount of $NH_3$ is 200 mmol/min, and the V/III ratio is 2500. As gas conditions of the GaN layer 402b, a nitrogen atmosphere is used, the supply amount of TMG is 100 μmol/min, the supply amount of $NH_3$ is 200 mmol/min, and the VIII ratio is 2000. The supply amount of $NH_3$ in growth of the GaN layer 402b is the same as that in growth of the MN layer 402a. Therefore, growth is not interrupted but continued.

After growth of the low refractive index layer 402, a laminated structure of the $In_{1.10}Ga_{0.90}N$ layer 403a having a thickness of 10 nm and the GaN layer 403b having a thickness of 10 nm is grown as the high refractive index layer 403 while the temperature of the substrate 401 is kept at 800° C. At this time, the $In_{1.10}Ga_{0.90}N$ layer 403a is grown first, and the $In_{0.10}Ga_{0.90}N$ layer 403a and the GaN layer 403b are grown for two cycles in total. As gas conditions of the $In_{1.10}Ga_{0.90}N$ layer 403a, a nitrogen atmosphere is used, the supply amount of TMG is 100 μmol/min, the supply amount of TMI is 70 μmol/min, the supply amount of $NH_3$ is 200 mmol/min, and the VIII ratio is 1176. As gas conditions of the GaN layer 403b, a nitrogen atmosphere is used, the supply amount of TMG is 100 μmol/min, the supply amount of $NH_3$ is 200 mmol/min, and the VIII ratio is 2000. The supply amount of each of TMG and $NH_3$ in growth of the $In_{1.10}Ga_{0.90}N$ layer 403a is the same as that in growth of the GaN layer 403b. Therefore, growth is not interrupted but continued.

Thereafter, the growth of the laminated structure of the AlN layer 402a and the GaN layer 402b and the growth of the laminated structure of the $In_{1.10}Ga_{0.90}N$ layer 403a and the GaN layer 403b are alternately repeated 73 times in total.

In this manner, the reflector 400 having a reflectance of 99.9% and a reflection wavelength of 450 nm is obtained.

Fifth Embodiment

Figure 7:
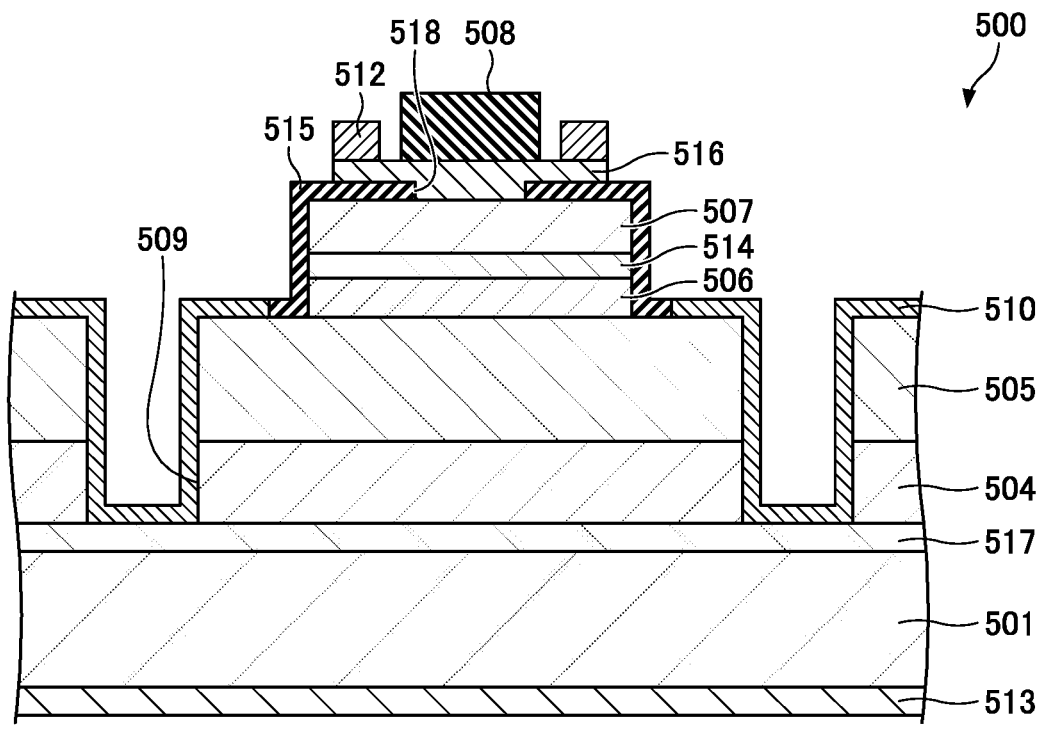
FIG. 7 is a cross-sectional view illustrating a surface emitting laser according to a fifth embodiment.

Next, a fifth embodiment will be described. The fifth embodiment relates to a surface emitting laser. FIG. 7 is a cross-sectional view illustrating the surface emitting laser according to the fifth embodiment.

As illustrated in FIG. 7, a surface emitting laser 500 according to the fifth embodiment includes a substrate 501 having conductivity and including GaN, a buffer layer 517 on the substrate 501, a first reflector 504 on the buffer layer 517, and a first conductivity type first spacer layer (first semiconductor layer) 505 on the first reflector 504. The surface emitting laser 500 further includes an active layer 506 on the first spacer layer 505, an electron blocking layer 514 on the active layer 506, and a second conductivity type second spacer layer (second semiconductor layer) 507 on the electron blocking layer 514. The laminate of the active layer 506, the electron blocking layer 514, and the second spacer layer 507 has a mesa structure 511.

The surface emitting laser 500 has a current confinement structure including an insulating film 515 and a transparent electrode 516. The insulating film 515 covers a side wall of the mesa structure 511 and covers an upper surface of the mesa structure 511 excluding the central portion thereof. That is, in the insulating film 515, an opening 518 exposing a part of the upper surface of the mesa structure 511 is formed. The transparent electrode 516 is in contact with the upper surface of the mesa structure 511 through the opening 518. The surface emitting laser 500 includes a second reflector 508 on the transparent electrode 516, an upper electrode 512 on a surface of the transparent electrode 516, and a lower electrode 513 on a back surface of the substrate 501. An opening 509 is formed in the first reflector 504 and the first spacer layer 505, and a conductive portion 510 is disposed in the opening 509. That is, the surface emitting laser 500 includes the conductive portion 510 for electrically coupling the substrate 501 to the first spacer layer 505 in the opening 509.

The substrate 501 is, for example, a GaN substrate. The buffer layer 517 is an n-GaN layer having a film thickness of 1 μm, for example, doped with Si at a concentration of $3 \times 10^{18}$ cm'. The first reflector 504 includes the reflector 100 or the reflector 400. The first spacer layer 505 is, for example, an n-GaN layer having a film thickness of 1 μm. The substrate 501 on which the buffer layer 517 is formed can be regarded as one substrate having conductivity.

The active layer 506 has, for example, a multi-quantum well structure of three cycles of $In_{0.09}Ga_{0.91}N$/GaN. For example, the film thickness of the $In_{0.09}Ga_{0.91}N$ layer which is a well layer and the film thickness of the GaN layer which is a barrier layer are 6 nm and 4 nm, respectively.

The electron blocking layer 514 is, for example, a p-$Al_{0.20}Ga_{0.80}N$ layer having a film thickness of 20 nm. The electron blocking layer 514 has an effect of strengthening confinement of electrons in the active layer 506. The second spacer layer 507 is, for example, a p-GaN layer having a film thickness of 50 nm.

The insulating film 515 is, for example, a $SiO_2$ film, and the transparent electrode 516 is, for example, an indium tin oxide (ITO) film.

The conductive portion 510 is, for example, a metal film of Ti/Al. The upper electrode 512 is, for example, a metal electrode of Ni/Au, and the lower electrode 513 is, for example, a metal electrode of Ti/Al.

The second reflector 508 is, for example, a dielectric reflector having a laminated structure in which a $Ta_2O_5$ layer as a high refractive index layer and a $SiO_2$ layer as a low refractive index layer are alternately laminated for eight cycles. The active layer 506 is configured so as to obtain an oscillation wavelength λ of 405 nm. The optical film thickness of the $Ta_2O_5$ layer is about 20% thicker than 114, and the optical film thickness of the SiO$_2$ layer is about 20% thinner than 114. The reflectance of such a second reflector 508 is 99.57%. In a case where the optical film thickness of each of the Ta$_2$O$_5$ layer and the SiO$_2$ layer is AA, the reflectance of the second reflector 508 is 99.69%.

In the surface emitting laser 500 configured as described above according to the fifth embodiment, the reflectance of the second reflector 508 is lower than the reflectance of the first reflector 504. In the surface emitting laser 500 according to the fifth embodiment, when a voltage is applied between the upper electrode 512 and the lower electrode 513, carriers are injected into the active layer 506, the surface emitting laser 500 oscillates a laser, and light can be sufficiently extracted from a side of the second reflector 508.

The first reflector 504 has good heat dissipation. Therefore, heat generated in the active layer 506 can be released with high efficiency through the substrate 501.

Sixth Embodiment

Figure 8:
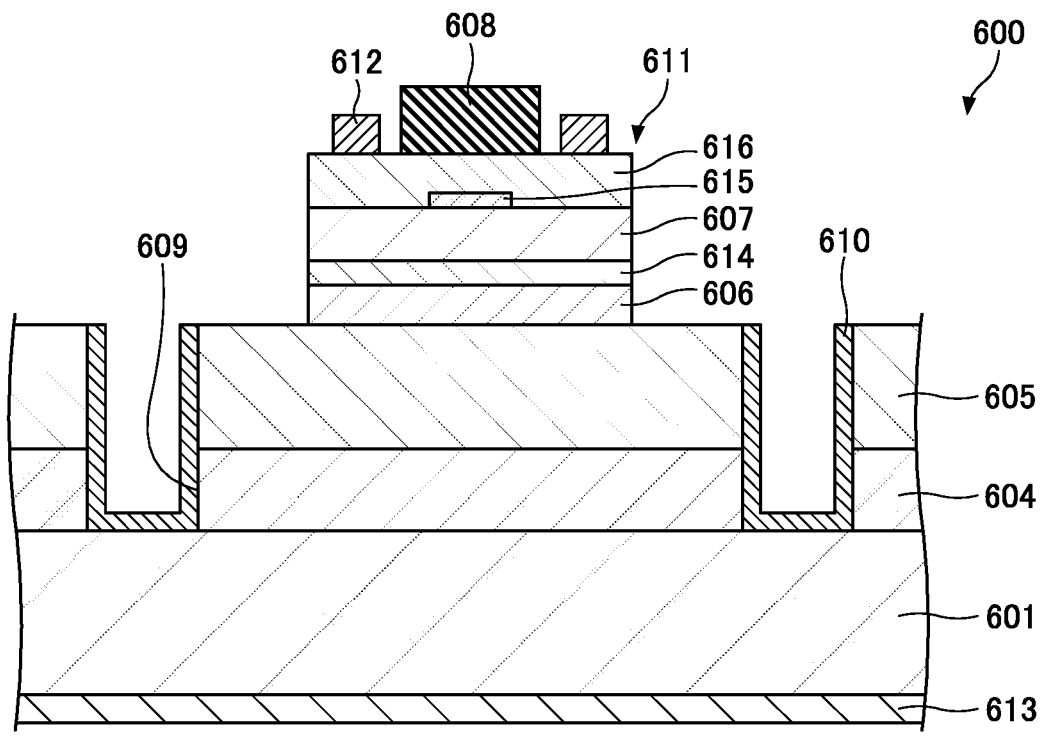
FIG. 8 is a cross-sectional view illustrating a surface emitting laser according to a sixth embodiment.

Next, a sixth embodiment will be described. The sixth embodiment relates to a surface emitting laser. FIG. 8 is a cross-sectional view illustrating the surface emitting laser according to the sixth embodiment.

As illustrated in FIG. 8, a surface emitting laser 600 according to the sixth embodiment includes a substrate 601 having conductivity and including GaN, a first reflector 604 on the substrate 601, and a first conductivity type first spacer layer (first semiconductor layer) 605 on the first reflector 604. The surface emitting laser 600 further includes an active layer 606 on the first spacer layer 605, an electron blocking layer 614 on the active layer 606, and a second conductivity type second spacer layer (second semiconductor layer) 607 on the electron blocking layer 614.

The surface emitting laser 600 includes a tunnel junction 615 on the second spacer layer 607 and a contact layer (fourth semiconductor layer) 616 covering the tunnel junction 615 on the second spacer layer 607. The laminate of the active layer 606, the electron blocking layer 614, the second spacer layer 607, the tunnel junction 615, and the contact layer 616 has a mesa structure 611. The tunnel junction 615 is disposed on the central portion of the second spacer layer 607. The surface emitting laser 600 includes a second reflector 608 on the contact layer 616, an upper electrode 612 on a surface of the contact layer 616, and a lower electrode 613 on a back surface of the substrate 601. An opening 609 is formed in the first reflector 604 and the first spacer layer 605, and a conductive portion 610 is disposed in the opening 609. That is, the surface emitting laser 600 includes the conductive portion 610 for electrically coupling the substrate 601 to the first spacer layer 605 in the opening 609.

The substrate 601 is, for example, a GaN substrate. The first reflector 604 includes the reflector 100 or the reflector 400. The first spacer layer 605 is, for example, an n-GaN layer having a film thickness of 1 μm. The active layer 606 has, for example, a multi-quantum well structure of In$_{0.20}$Ga$_{0.80}$N/GaN.

The electron blocking layer 614 is, for example, a p-Al$_{0.20}$Ga$_{0.80}$N layer having a film thickness of 20 nm. The electron blocking layer 614 has an effect of strengthening confinement of electrons in the active layer 606. The second spacer layer 607 is, for example, a p-GaN layer having a film thickness of 50 nm.

The tunnel junction 615 includes a p-GaN layer doped with Mg at a concentration of about $1 \times 10^{20}$ cm$^{-3}$ and an n-GaN layer doped with Si at a concentration of about $1 \times 10^{20}$ cm$^{-3}$, and has a columnar shape. The contact layer 616 is, for example, an n-GaN layer.

The conductive portion 610 is, for example, an n-GaN layer. The upper electrode 612 is, for example, a metal electrode of Ti/Al, and the lower electrode 613 is, for example, a metal electrode of Ti/Al.

The second reflector 608 is, for example, a dielectric reflector having a laminated structure in which a SiO$_2$ layer and a Ta$_2$O$_5$ layer are alternately laminated for six cycles on a laminate in which a SiO$_2$ layer and a SiN layer are alternately laminated for two cycles. The active layer 606 is configured so as to obtain an oscillation wavelength λ of 450 nm. The second reflector 608 has a reflectance of 99.49%.

In the surface emitting laser 600 configured as described above according to the sixth embodiment, the reflectance of the second reflector 608 is lower than the reflectance of the first reflector 604. In the surface emitting laser 600 according to the sixth embodiment, when a voltage is applied between the upper electrode 612 and the lower electrode 613, carriers are injected into the active layer 606, the surface emitting laser 600 oscillates a laser, and light can be sufficiently extracted from a side of the second reflector 608.

The first reflector 604 has good heat dissipation. Therefore, heat generated in the active layer 606 can be released with high efficiency through the substrate 601.

Regarding formation of the tunnel junction 615 and the contact layer 616, the p-GaN layer and the n-GaN layer included in the tunnel junction 615 are grown subsequent to the second spacer layer 607, for example. Thereafter, the p-GaN layer and the n-GaN layer are processed into a columnar shape by photolithography and dry etching to form the tunnel junction 615. Thereafter, the contact layer 616 is grown so as to cover the tunnel junction 615, and the laminate of the active layer 606, the electron blocking layer 614, the second spacer layer 607, the tunnel junction 615, and the contact layer 616 is processed to form the mesa structure 611.

Regarding the formation of the conductive portion 610, after formation of the mesa structure 611, at least the mesa structure 611 is covered, a mask to hinder growth of the semiconductor is formed so as to open a portion where the conductive portion 610 is to be formed, and an n-GaN layer is grown in a portion where the mask is not formed by a crystal growth method. As a result, a crystal grows from a side wall of the opening 609 with the first spacer layer 605 and the first reflector 604, and finally, the conductive portion 610 is formed between the substrate 601 and the first spacer layer 605. Examples of a material of the mask include SiO$_2$.

Seventh Embodiment

Figure 9B:
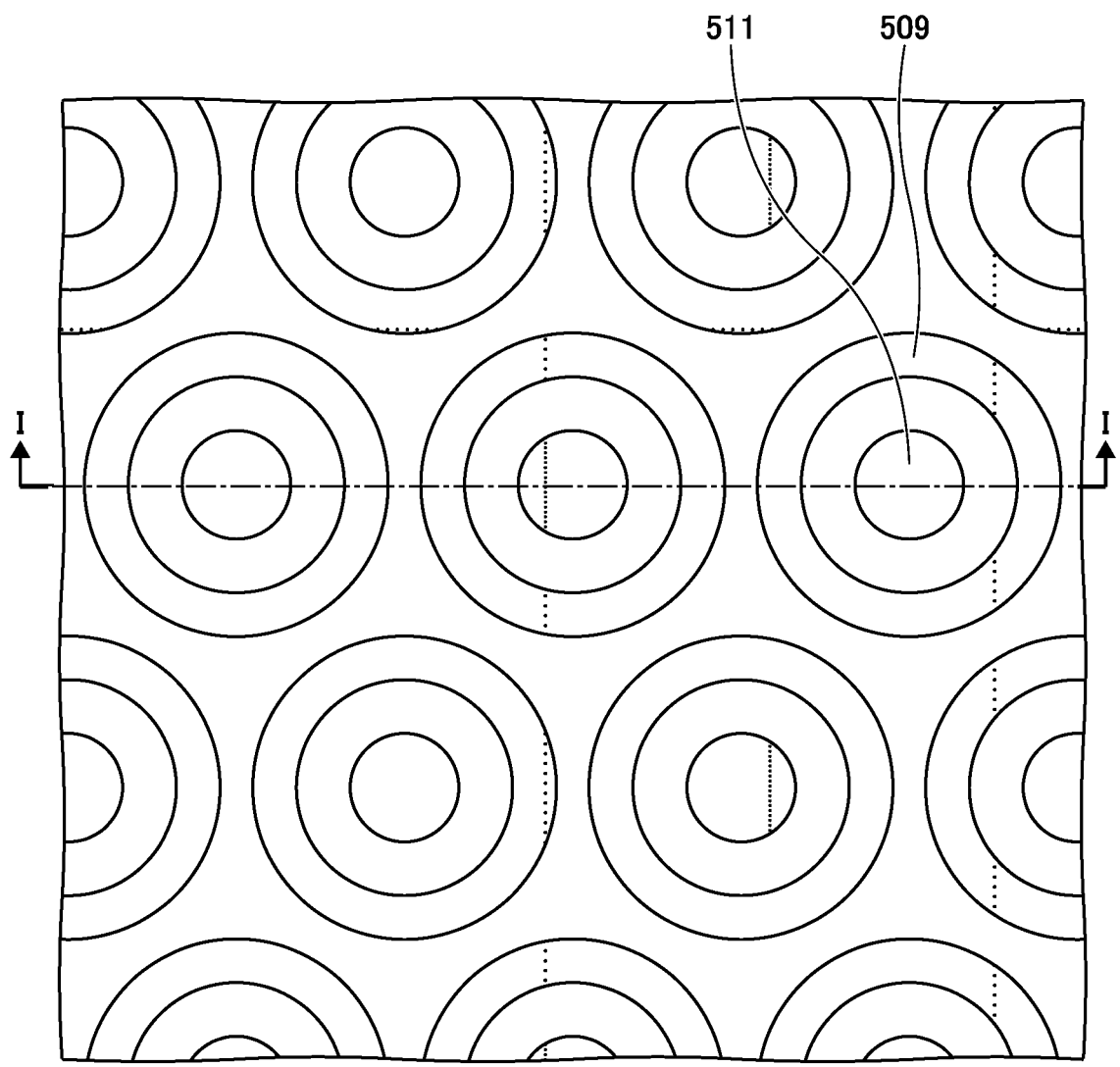
FIG. 9B is a diagram illustrating a layout of the two-dimensional array light source according to the seventh embodiment.

Next, a seventh embodiment will be described. The seventh embodiment relates to a two-dimensional array light source. The two-dimensional array light source is an example of a surface emitting laser. FIG. 9A is a cross-sectional view illustrating the two-dimensional array light source according to the seventh embodiment, and FIG. 9B is a diagram illustrating a layout of the two-dimensional array light source according to the seventh embodiment. FIG. 9A corresponds to a cross-sectional view taken along line I-I in FIG. 9B.

As illustrated in FIG. 9A, a two-dimensional array light source 700 according to the seventh embodiment has a structure in which a plurality of surface emitting lasers similar to the surface emitting laser 500 is arranged in a plane. However, in the fifth embodiment, one upper electrode 512 is disposed for one surface emitting laser 500, whereas in the seventh embodiment, an upper common electrode 712 common to the plurality of surface emitting lasers is disposed. That is, one upper common electrode 712 is electrically coupled to a plurality of second spacer layers 507. The upper common electrode 712 is, for example, a Ti/Al metal electrode. An insulating layer 720 electrically insulating the upper common electrode 712 from a first spacer layer 505 and a conductive portion 510 is disposed. The insulating layer 720 covers the first spacer layer 505 and the conductive portion 510 and also covers a side wall of a mesa structure 511. The insulating layer 720 is, for example, a SiO$_2$ layer.

As illustrated in FIG. 9B, the mesa structures 511 are arranged in an equilateral triangular lattice shape, and an opening 509 is formed independently for each of the mesa structures 511. That is, each of the mesa structures 511 is surrounded by one opening 509.

In the two-dimensional array light source 700 according to the seventh embodiment, by applying a voltage between the upper common electrode 712 and a lower electrode 513, carriers are injected into each of the surface emitting lasers, and each of the surface emitting lasers emits light.

In a case where a pitch between the surface emitting lasers (distance between the centers of the closest surface emitting lasers) is 54 µm, the diameter of the mesa structure 511 is 28 µm, the width of the opening 509 is 5 µm, and a distance between the mesa structure 511 and the opening 509 is 3 µm, about 20000 surface emitting lasers can be arranged per square cm of a chip.

Eighth Embodiment

Figure 10A:
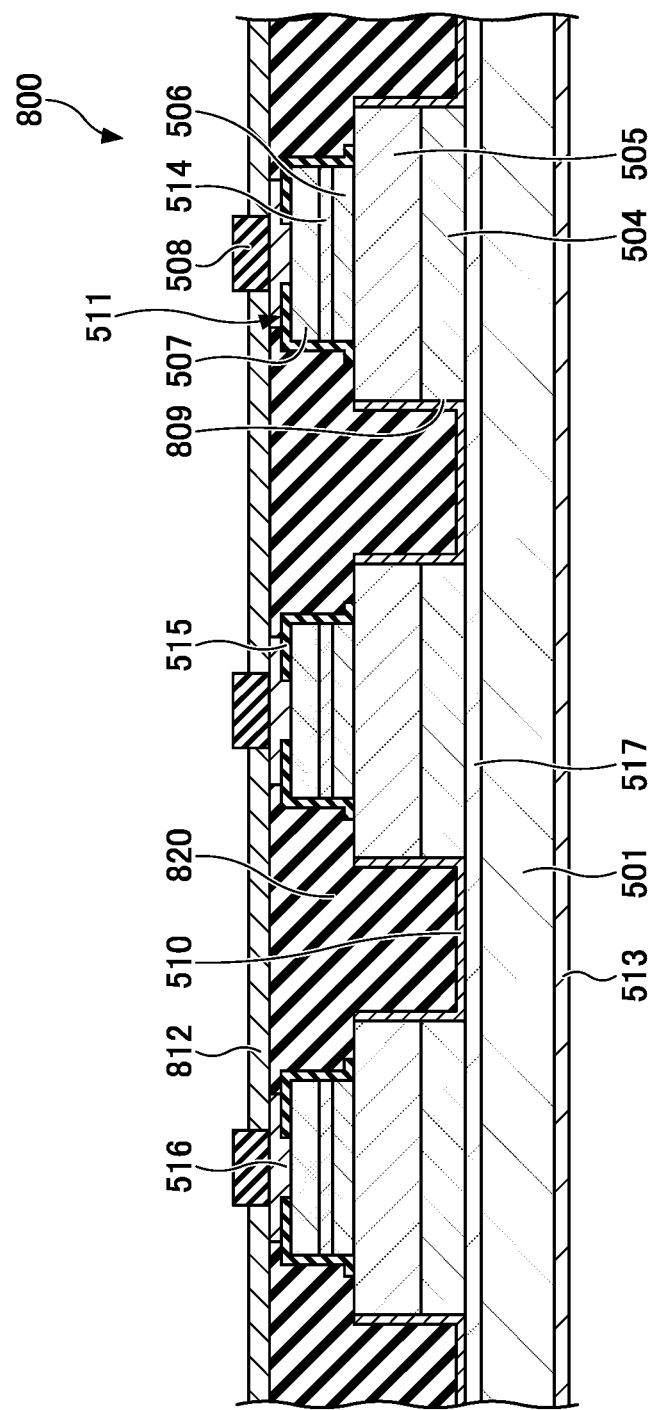
FIG. 10A is a cross-sectional view illustrating a two-dimensional array light source according to an eighth embodiment.
Figure 10B:
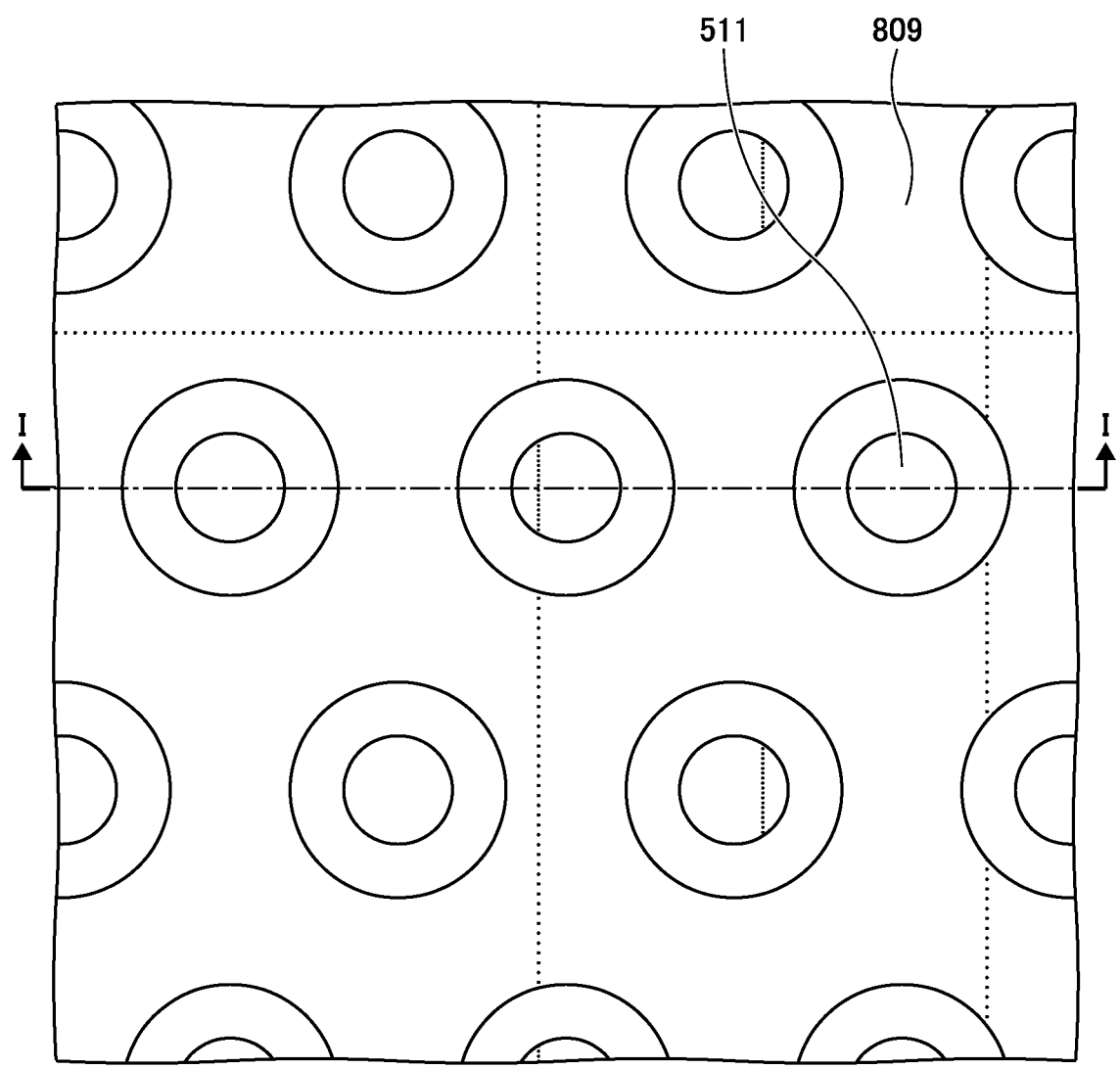
FIG. 10B is a diagram illustrating a layout of the two-dimensional array light source according to the eighth embodiment.

Next, an eighth embodiment will be described. The eighth embodiment relates to a two-dimensional array light source. The two-dimensional array light source is an example of a surface emitting laser. FIG. 10A is a cross-sectional view illustrating the two-dimensional array light source according to the eighth embodiment, and FIG. 10B is a diagram illustrating a layout of the two-dimensional array light source according to the eighth embodiment. FIG. 10A corresponds to a cross-sectional view taken along line I-I in FIG. 10B.

As illustrated in FIG. 10A, the two-dimensional array light source 800 according to the eighth embodiment has a structure in which a plurality of surface emitting lasers similar to the surface emitting laser 500 is arranged in a plane. However, in the fifth embodiment, one upper electrode 512 is disposed for one surface emitting laser 500, whereas in the eighth embodiment, an upper common electrode 812 common to the plurality of surface emitting lasers is disposed. That is, one upper common electrode 812 is electrically coupled to a plurality of second spacer layers 507. The upper common electrode 812 is, for example, a Ti/Al metal electrode. An insulating layer 820 electrically insulating the upper common electrode 812 from a first spacer layer 505 and a conductive portion 510 is disposed. The insulating layer 820 covers the first spacer layer 505 and the conductive portion 510 and also covers a side wall of a mesa structure 511. The insulating layer 820 is, for example, a SiO$_2$ layer.

As illustrated in FIG. 10B, the mesa structures 511 are arranged in an equilateral triangular lattice shape, and a single opening 809 is formed around the plurality of mesa structures 511. That is, the opening 809 is shared by the plurality of surface emitting lasers.

In the two-dimensional array light source 800 according to the eighth embodiment, by applying a voltage between the upper common electrode 812 and a lower electrode 513, carriers are injected into each of the surface emitting lasers, and each of the surface emitting lasers emits light.

In a case where a pitch between the surface emitting lasers (distance between the centers of the closest surface emitting lasers) is 40 µm, the diameter of the mesa structure 511 is 28 µm, and a distance between the mesa structure 511 and the opening 509 is 3 µm, about 36000 surface emitting lasers can be arranged per square cm of a chip.

Ninth Embodiment

Figure 11A:
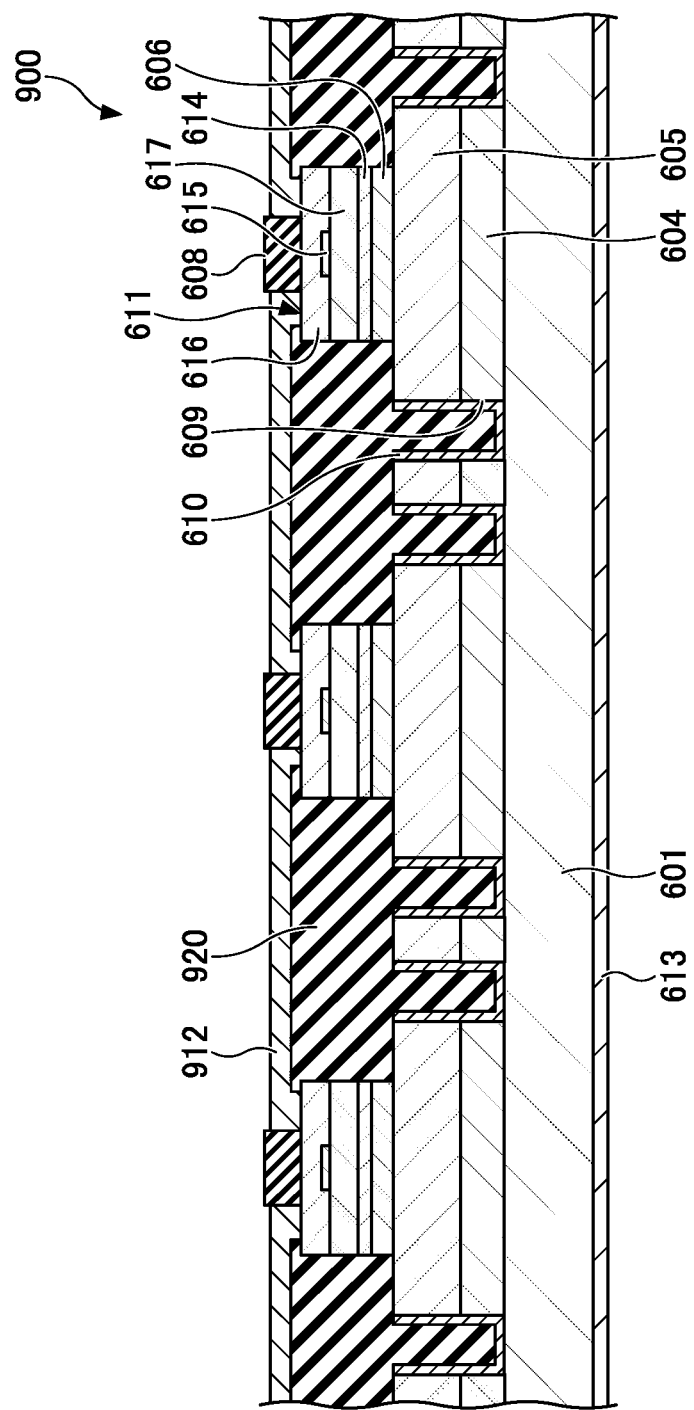
FIG. 11A is a cross-sectional view illustrating a two-dimensional array light source according to a ninth embodiment.
Figure 11B:
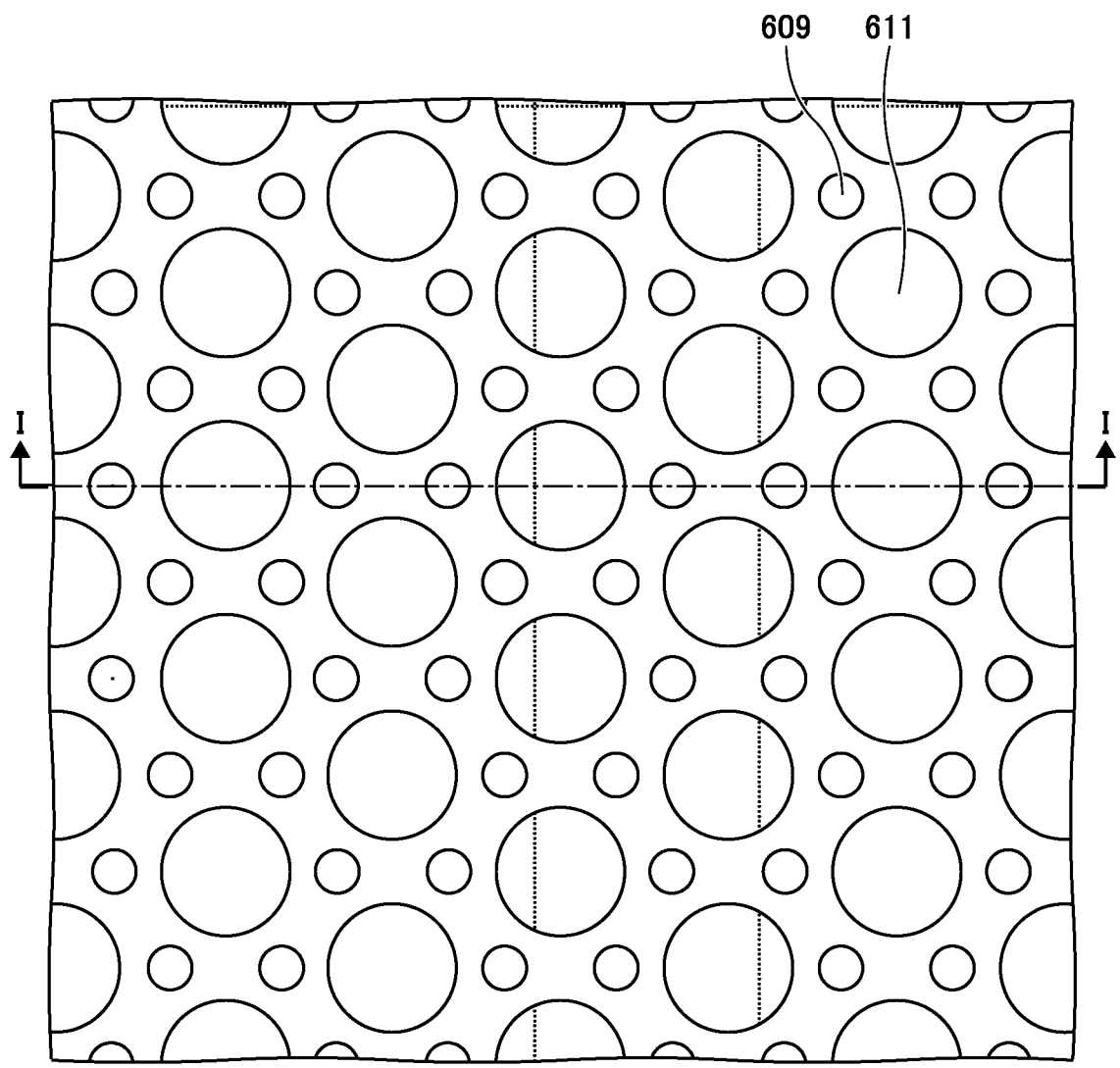
FIG. 11B is a diagram illustrating a layout of the two-dimensional array light source according to the ninth embodiment.

Next, a ninth embodiment will be described. The ninth embodiment relates to a two-dimensional array light source. The two-dimensional array light source is an example of a surface emitting laser. FIG. 11A is a cross-sectional view illustrating the two-dimensional array light source according to the ninth embodiment, and FIG. 11B is a diagram illustrating a layout of the two-dimensional array light source according to the ninth embodiment. FIG. 11A corresponds to a cross-sectional view taken along line I-I in FIG. 11B.

As illustrated in FIG. 11A, the two-dimensional array light source 900 according to the ninth embodiment has a structure in which a plurality of surface emitting lasers similar to the surface emitting laser 600 is arranged in a plane. However, in the sixth embodiment, one upper electrode 612 is disposed for one surface emitting laser 600, whereas in the ninth embodiment, an upper common electrode 912 common to the plurality of surface emitting lasers is disposed. That is, one upper common electrode 912 is electrically coupled to a plurality of contact layers 616. The upper common electrode 912 is, for example, a Ti/Al/Ti/Au metal electrode. An insulating layer 920 electrically insulating the upper common electrode 912 from a first spacer layer 605 and a conductive portion 610 is disposed. The insulating layer 920 covers the first spacer layer 605 and the conductive portion 610 and also covers a side wall of a mesa structure 611. The insulating layer 920 is, for example, a SiO$_2$ layer.

As illustrated in FIG. 11B, the mesa structures 611 are arranged in an equilateral triangular lattice shape, a plurality of (here, six) openings 609 is formed around one mesa structure 611, and the openings 609 are shared by adjacent mesa structures 611. That is, one opening 609 is formed in the center of gravity of adjacent mesa structure 611 forming lattice points.

In the two-dimensional array light source 900 according to the ninth embodiment, by applying a voltage between the upper common electrode 912 and a lower electrode 613, carriers are injected into each of the surface emitting lasers, and each of the surface emitting lasers emits light.

In a case where a pitch between the surface emitting lasers (distance between the centers of the closest surface emitting lasers) is 34 µm, the diameter of the mesa structure 611 is 28 µm, the width of the opening 609 is 6 µm, and a distance between the mesa structure 611 and the opening 609 is 3 µm, about 50000 surface emitting lasers can be arranged per square cm of a chip.

Incidentally, even in a surface emitting laser in which a reflector including a layer having a high electric resistance is disposed between a substrate having conductivity and a spacer layer like the first reflector according to an embodiment of the present disclosure, if an opening is formed in the reflector, and a conductive portion for electrically coupling the substrate to the spacer layer is disposed in the opening, excellent conductivity can be obtained between the spacer layer and the substrate. That is, irrespective of the layer configuration of the reflector between the substrate and the spacer layer, if the above opening portion and conductive portion are disposed, excellent conductivity can be obtained.

Tenth Embodiment

Figure 12:
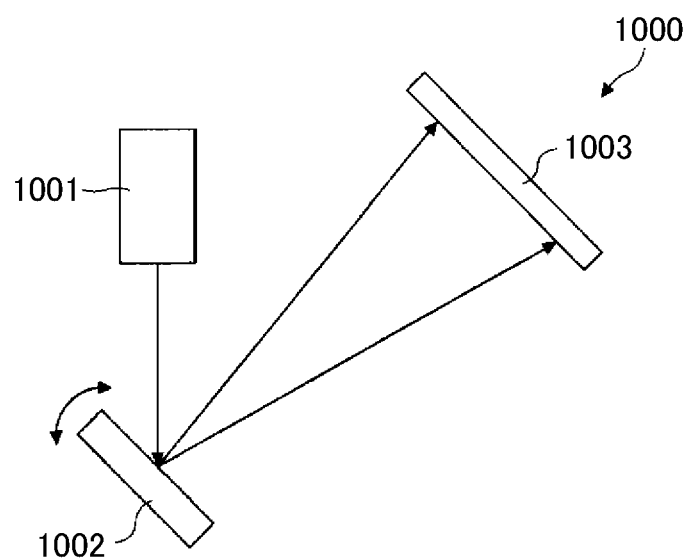
FIG. 12 is a diagram illustrating a layout of a projection apparatus according to a tenth embodiment.

Next, a tenth embodiment will be described. The tenth embodiment relates to a projection apparatus for performing a scan with a laser to draw an image. The projection apparatus is an example of a light source apparatus. FIG. 12 is a diagram illustrating a layout of the projection apparatus according to the tenth embodiment.

A projection apparatus 1000 according to the tenth embodiment includes a light source 1001 and an optical scanner 1002. The light source 1001 includes, for example, one or more surface emitting lasers 200 according to the second embodiment or one or more two-dimensional array light sources 300 according to the third embodiment. In a case where the light source 1001 includes one surface emitting laser 200 or one two-dimensional array light source 300, the projection apparatus 1000 projects a monochrome image onto an object 1003. In a case where the light source 1001 includes a plurality of surface emitting lasers 200 or a plurality of two-dimensional array light sources 300, by aligning optical axes of the surface emitting lasers coaxially, emitting light from an emitting surface, and changing an oscillating wavelength for each of the surface emitting lasers, the projection apparatus 1000 can project an image of a plurality of colors onto the object 1003.

The optical scanner 1002 includes an element for performing a scan with a laser beam emitted from the light source 1001 and projecting an image onto the object 1003. As such an element, it is possible to use, for example, an element combining two micro electro mechanical systems (MEMS) mirrors such as a MEMS mirror movable in two axis directions or a MEMS mirror movable in one axis direction. The optical scanner 1002 is an example of an optical element for adjusting a traveling direction of a laser beam emitted from the light source 1001.

When an image is generated, the intensity of a laser beam is modulated in accordance with scanning of the optical scanner 1002, and the object 1003 is irradiated with the laser beam. In this way, it is possible to generate an image directly on the object 1003.

In a case where the surface emitting laser 200 is used as the light source 1001, it is possible to output a laser beam having an order of µW to several mW and to draw an image in a minute area. Such a projection apparatus 1000 can be used, for example, as a retina display.

In a case where a two-dimensional array light source is used as the light source 1001, it is possible to output a laser beam having an order of mW to kW and to draw an image in a large area. Such a projection apparatus can be used, for example, as a projector.

Eleventh Embodiment

Figure 13A:
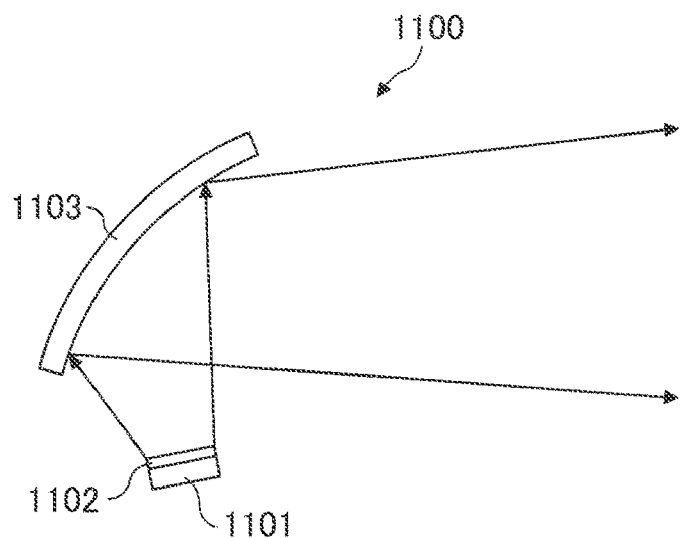
FIG. 13A is a diagram illustrating a layout of a light projecting apparatus according to an eleventh embodiment.
Figure 13B:
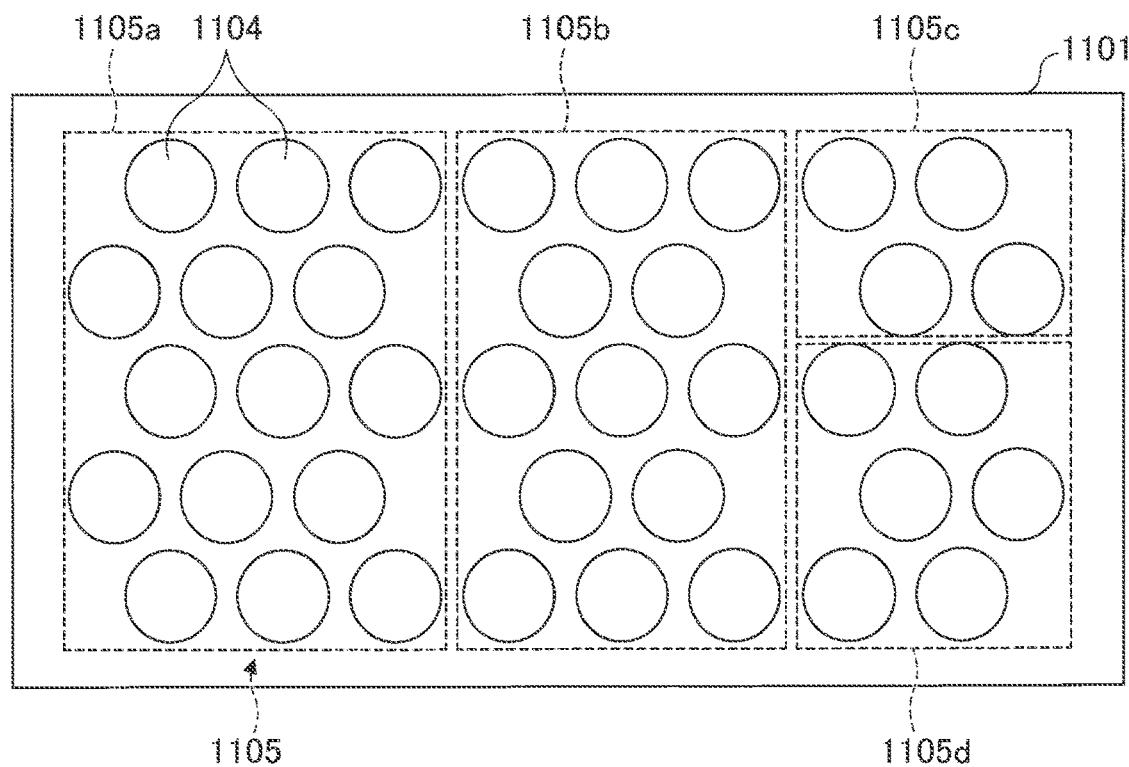
FIG. 13B is a diagram illustrating a layout of a light source of the light projecting apparatus according to the eleventh embodiment.

Next, an eleventh embodiment will be described. The eleventh embodiment relates to a light projecting apparatus. The light projecting apparatus is an example of a light source apparatus. FIG. 13A is a diagram illustrating a layout of the light projecting apparatus according to the eleventh embodiment. FIG. 13B is a diagram illustrating a layout of a light source of the light projecting apparatus according to the eleventh embodiment.

A light projecting apparatus 1100 according to the eleventh embodiment includes a light source 1101, a fluorescent member 1102, and a light projecting member 1103. As the light source 1101, for example, the two-dimensional array light source 300 according to the third embodiment is used to excite the fluorescent member 1102 with light emitted from the light source 1101. The light emitted from the light source 1101 and light emitted by excitation of the fluorescent member 1102 are two-dimensionally expanded and projected by the light projecting member 1103. FIG. 13A illustrates a reflector as an example of the light projecting member 1103.

As the fluorescent member 1102, for example, in a case where light emitted from the light source 1101 is blue light, a fluorescent member that emits yellow light is used, and in a case where light emitted from the light source 1101 is ultraviolet light, a fluorescent member that emits white light is used. The fluorescent member 1102 is an example of an optical element for adjusting the wavelength of a laser beam emitted from the light source 1101. The light projecting member 1103 is an example of an optical element for adjusting a traveling direction of a laser beam emitted from the light source 1101 and having a wavelength adjusted by the fluorescent member 1102.

As illustrated in FIG. 13B, the light source 1101 is, for example, a two-dimensional array light source in which thousands to tens of thousands of surface emitting lasers 1104 are arranged in a two-dimensional array in a plane, and includes a plurality of upper common electrodes 1105. In FIG. 13B, four upper common electrodes 1105a to 1105d are illustrated as the upper common electrode 1105.

By selecting an upper common electrode to which a voltage is applied from among the plurality of upper common electrodes 1105, light can be projected onto an arbitrary place or space with one light source 1101. For example, in a case where the light projecting apparatus 1100 is used as an on-vehicle headlight module, the light projecting apparatus 1100 can be used as a variable light distribution headlamp.

Twelfth Embodiment

Figure 14:
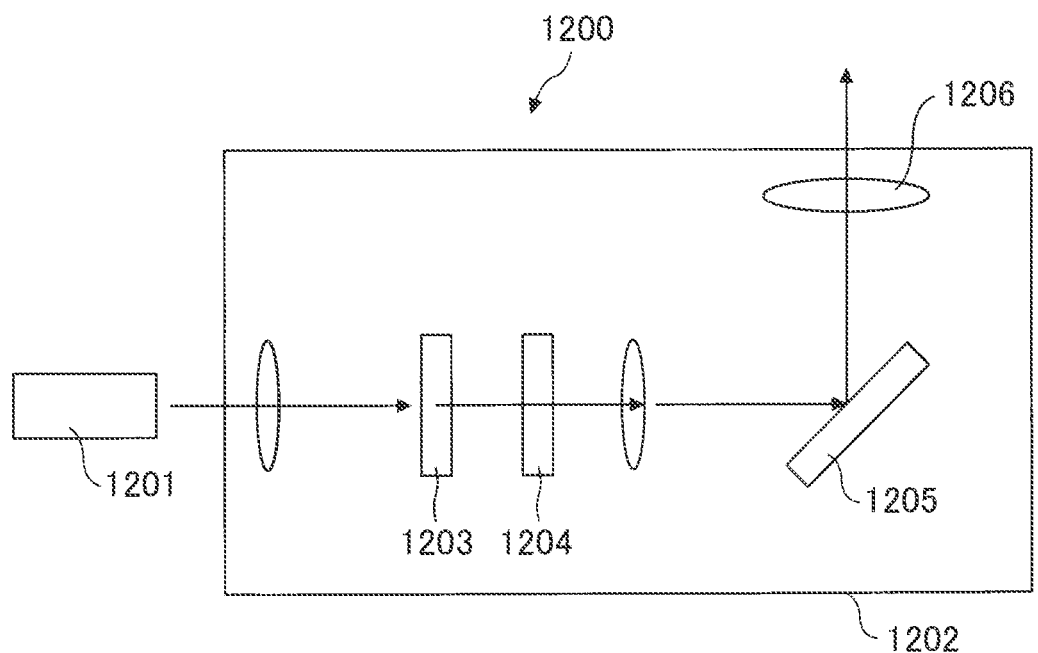
FIG. 14 is a diagram illustrating a layout of a projection apparatus according to a twelfth embodiment.

Next, a twelfth embodiment will be described. The twelfth embodiment relates to a projection apparatus. The projection apparatus is an example of a light source apparatus. FIG. 14 is a diagram illustrating a layout of the projection apparatus according to the twelfth embodiment.

A projection apparatus 1200 according to the twelfth embodiment includes a light source 1201 and a projection optical unit 1202. The light source 1201 includes the two-dimensional array light source 300 according to the third embodiment.

The projection optical unit 1202 includes at least a fluorescent member 1203, a filter 1204, and an image generation element 1205, and may further include a lens such as a projection lens 1206, a mirror, and the like, if necessary.

The fluorescent member 1203 is excited by a part of light incident on the projection optical unit 1202 from the light source 1201 to produce white light. As the fluorescent member 1203, for example, in a case where light emitted from the light source 1201 is blue light, a fluorescent member that emits yellow light is used, and in a case where light emitted from the light source 1201 is ultraviolet light, a fluorescent member that emits white light is used.

The filter 1204 separates a color from white light and also includes a movable unit. As the filter 1204, for example, a color wheel or the like for transmitting red, blue, or green light is used.

The image generation element 1205 generates an image from light that has passed through the filter 1204. As the image generation element 1205, for example, a MEMS device including fine mirrors arranged in a two-dimensional array, a reflection type liquid crystal element, or the like is used.

The projection lens 1206 enlarges an image generated by the image generation element 1205 to a desired magnification and projects the image onto an object.

The projection optical unit 1202 is an example of an optical element for adjusting the wavelength of a laser beam emitted from the light source 1201, the traveling direction thereof, and the like.

In the present embodiment, the projection optical unit 1202 includes the filter 1204, but a prism or a dichroic mirror may be used instead of the filter 1204. In a case where the prism or the dichroic mirror is used, it is possible to divide light into, for example, red, green, and blue, to generate images of respective colors with three image generation elements, and to finally synthesize the images with the prism or the like.

First Modification

A first modification is a modification of the specific example of the first embodiment in which the reflection wavelength λ is 405 nm. In the specific example of the first embodiment, the film thickness of each of the three GaN layers 102b included in the low refractive index layer 102 is 6 nm. Meanwhile, in the first modification, the film thickness of the GaN layer 102b between the two AlN layers 102a is reduced to 2 nm, and the film thickness of the GaN layer 102b between the high refractive index layer 103 and the AlN layer 102a is increased to 8 nm. In the specific example of the first embodiment, the lamination cycle of the low refractive index layer 102 and the high refractive index layer 103 is 46, whereas in the first modification, the lamination cycle is 40. The other configurations are similar to those of the specific example of the first embodiment.

According to the first modification having such a configuration, the reflectance can be 99.9% at a lamination cycle of 40. In this way, by bringing the AlN layer 102a closer to the central side of the low refractive index layer 102, it is possible to reduce the number of lamination cycles by six at the same reflectance as compared with the specific example of the first embodiment.

Second Modification

A second modification is a modification of the specific example of the fourth embodiment in which the reflection wavelength is 450 nm. In the specific example of the fourth embodiment, the film thickness of each of the three GaN layers 402b included in the low refractive index layer 402 is 14 nm. Meanwhile, in the second modification, the film thickness of the GaN layer 402b between the two AlN layers 402a is reduced to 5 nm, and the film thickness of the GaN layer 402b between the high refractive index layer 403 and the AlN layer 402a is increased to 18.5 nm. In the specific example of the fourth embodiment, the lamination cycle of the low refractive index layer 402 and the high refractive index layer 403 is 73, whereas in the second modification, the lamination cycle is 61. The other configurations are similar to those of the specific example of the fourth embodiment.

According to the second modification having such a configuration, the reflectance can be 99.9% at a lamination cycle of 61. In this way, by bringing the AlN layer 402a closer to the central side of the low refractive index layer 402, it is possible to reduce the number of lamination cycles by 12 at the same reflectance as compared with the specific example of the fourth embodiment.

Third Modification

A third modification is a modification of the specific example of the fourth embodiment and is based on an application in which the reflection wavelength is 530 nm. The low refractive index layer 402 includes three AlN layers 402a and four GaN layers 402b. The film thickness of each of the three AlN layers 402a is 7.5 nm. The film thickness of the GaN layer 402b between the high refractive index layer 403 and the AlN layer 402a is 6 nm, and the film thickness of the GaN layer 402b between two adjacent AlN layers 402a is 5 nm. The high refractive index layer 403 includes five $In_{0.10}Ga_{0.90}N$ layers 403a and four GaN layers 403b, and the film thicknesses of the $In_{0.10}Ga_{0.90}N$ layer 403a and the GaN layer 403b are 10 nm and 5 nm, respectively. The low refractive index layers 402 and the high refractive index layers 403 are alternately laminated for 53 cycles in total. In a case where the reflection wavelength is 530 nm, the refractive index of GaN is 2.35, the refractive index of AlN is 2.08, and the refractive index of $In_{0.10}Ga_{0.90}N$ is 2.40. Therefore, the optical film thickness of the low refractive index layer 402 is 98.5 nm, the optical film thickness of the high refractive index layer 403 is 167 nm, the optical film thickness of the low refractive index layer 402 is about 25% thinner than $\lambda/4$ (=132.5 nm), and the optical film thickness of the high refractive index layer 403 is about 25% thicker than $\lambda/4$. In this case, a product $P_{AlN}$ of distortion of the AlN layer 402a and the film thickness thereof is 0.96 times a product $P_{InGaN}$ of distortion of the $In_{0.10}Ga_{0.90}N$ layer 403a and the film thickness thereof, and the deformation amount of the AlN layer 402a is substantially equal to the deformation amount of the $In_{1.10}Ga_{0.90}N$ layer 403a.

According to the third modification having such a configuration, the reflectance can be 99.9% at a lamination cycle of 53.

(First Simulation)

Next, a simulation concerning heat dissipation (first simulation) will be described.

In the first simulation, the fifth embodiment is used, and the reflector in the specific example of the first embodiment is used as the first reflector 504. That is, the low refractive index layer 102 includes two AN layers 102a and three GaN layers 102b, and the film thickness of each of the AlN layers 102a and the GaN layers 102b is 6 nm. The high refractive index layer 103 includes an $In_{0.05}Ga_{0.95}N$ layer having a film thickness of 50 nm. The substrate 501 is a GaN substrate having a thickness of 150 μm. The second reflector 508 is a dielectric reflector having a laminated structure in which a $Ta_2O_5$ layer and a $SiO_2$ layer are alternately laminated for eight cycles. The diameter (current confinement diameter) of the opening 518 is assumed to be 5 gimp. Efficiency is assumed to be 20% at an output of 3.2 mW. The temperature of a lower portion of the substrate 501 is fixed at 27° C., and heat distribution is calculated by a finite element method.

For comparison, similar heat distribution is also calculated by the finite element method for a first comparative example using an $Al_{0.50}Ga_{0.50}N$ layer instead of the low refractive index layer 102.

According to such a simulation, the center temperature of the active layer 506 is 49.8° C. in the first comparative example, whereas in the fifth embodiment, the center temperature of the active layer 506 is 41.8° C. There is a difference of 8° C. therebetween. This indicates that heat dissipation in the fifth embodiment is extremely high. In the first comparative example, as heat distribution, a distance from the center of a surface emitting laser to a point at which the temperature is 29° C. which is 2° C. higher than the temperature (27° C.) of the substrate 501 in an in-plane direction of a substrate surface is 27 μm, whereas in the fifth embodiment, the distance is 23.5 μm. There is a difference of 3.5 μm therebetween. This indicates that in the two-dimensional array using the fifth embodiment, even if the distance between the surface emitting lasers is reduced, the adjacent surface emitting lasers are hardly affected by heat.

(Second Simulation)

Next, a simulation concerning the first spacer layer (second simulation) will be described.

In the second simulation, the sixth embodiment is used. It is assumed that the resistivity of the n-GaN layer as the first spacer layer 605 is $7\times10^{-3}$ Ωcm, the resistivity of the p-GaN layer as the second spacer layer 607 is 1 Ωcm, the resistivity of the tunnel junction 615 is $1\times10^{-5}$ Ωcm$^2$, and the diameter (current confinement diameter) of the tunnel junction 615 is 5 μmφ. The thickness of the first spacer layer 605 is changed, and a resistance between the upper electrode 612 and the lower electrode 613 is calculated.

Figure 15:
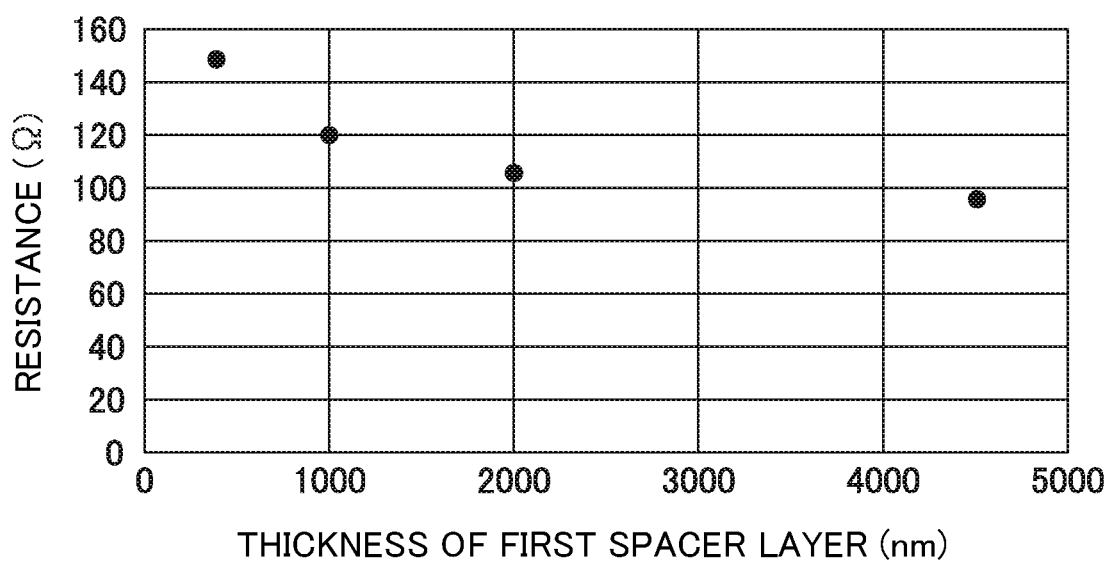
FIG. 15 is a graph illustrating a relationship between the thickness of a first spacer layer and resistance between electrodes.

FIG. 15 illustrates the results. As illustrated in FIG. 15, in a case where the thickness of the first spacer layer 605 is less than 1 μm, the resistance largely changes depending on the thickness of the first spacer layer 605. Meanwhile, in a case where the thickness of the first spacer layer 605 is 1 μm or more, even if the first spacer layer 605 is thicker, the resistance does not largely decrease, and a decrease ratio of the resistance with respect to an increase in thickness is small. This indicates that it is possible to suppress variation in resistance while suppressing the resistance if the thickness of the first spacer layer 605 is 1 μm or more.

(Third Simulation)

Next, a simulation concerning the second reflector (third simulation) will be described.

In the third simulation, the fifth embodiment in which the oscillation wavelength is 405 nm is used, and a relationship between the thicknesses of eight cycles of the $Ta_2O_5$ layers (high refractive index layers) and the $SiO_2$ layers (low refractive index layers) constituting the second reflector 508 and the reflectance of the second reflector 508 is calculated. Table 1 illustrates the results. The numerical values in Table 1 indicate increase/decrease values with respect to the thickness (λ/4) which is ¼ of the oscillation wavelength λ.

TABLE 1

| Optical film thickness | | |
| --- | --- | --- |
| $Ta_2O_5$ (n = 2.30) | $SiO_2$ (n = 1.47) | Reflectance |
| +40% | −40% | 0.9885 |
| +30% | −30% | 0.9935 |
| +20% | −20% | 0.9957 |
| +10% | −10% | 0.9966 |
| ±0% | ±0% | 0.9969 |
| −10% | +10% | 0.9966 |
| −20% | +20% | 0.9957 |
| −30% | +30% | 0.9935 |
| −40% | +40% | 0.9885 |

(Fourth Simulation)

Next, a simulation concerning the second reflector (fourth simulation) will be described.

In the fourth simulation, the sixth embodiment in which the oscillation wavelength is 450 nm is used, and a relationship between the configuration of the second reflector 508 and the reflectance thereof is calculated. Here, the second reflector 508 is assumed to include at least one of a first laminate in which a SiN layer and a $SiO_2$ layer are alternately laminated and a second laminate in which a $Ta_2O_5$ layer and a $SiO_2$ layer are alternately laminated for eight cycles in total. Table 2 illustrates the results.

TABLE 2

| Number of cycles | | |
| --- | --- | --- |
| First laminate SiN (n = 2.05)/$SiO_2$ (n = 1.45) | Second laminate $Ta_2O_5$ (n = 2.25)/$SiO_2$ (n = 1.45) | Reflectance |
| 0 | 8 | 0.9964 |
| 1 | 7 | 0.9957 |
| 2 | 6 | 0.9949 |
| 3 | 5 | 0.9938 |
| 4 | 4 | 0.9926 |
| 5 | 3 | 0.9910 |
| 6 | 2 | 0.9892 |
| 7 | 1 | 0.9871 |
| 8 | 0 | 0.9844 |

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A reflector, comprising:
 a low refractive index layer having a first average refractive index and having a laminated structure in which an AlN layer and a GaN layer are alternately laminated; and
 a high refractive index layer directly next to and in physical contact with the low refractive index layer, the high refractive index layer having a second average refractive index higher than the first average refractive index and including an InGaN layer,
 wherein the laminated structure of the low refractive index layer includes a GaN layer adjacent to the high refractive index layer, and the GaN layer adjacent to the high refractive index layer is thicker than other GaN layer in the laminated structure of the low refractive index layer, and
 the sum of the optical film thicknesses of the low refractive index layer and the high refractive index layer is λ/2.

2. The reflector according to claim 1, wherein an optical film thickness of the high refractive index layer is different from an optical film thickness of the low refractive index layer.

3. The reflector according to claim 2, wherein the optical film thickness of the high refractive index layer is larger than the optical film thickness of the low refractive index layer.

4. The reflector according to claim 1, wherein the high refractive index layer has a laminated structure in which the InGaN layer and the GaN layer are alternately laminated.

5. The reflector according to claim 1, wherein an In composition of the InGaN layer is 0.02 or more and less than 0.20.

6. The reflector according to claim 1, wherein
the low refractive index layer and the high refractive index layer are undoped, and
an interface between the low refractive index layer and the high refractive index layer has an impurity concentration of $1 \times 10^{17}$ cm$^{-3}$ or less.

7. The reflector according to claim 1, wherein the low refractive index layer and the high refractive index layer are doped with impurities, and an interface between the low refractive index layer and the high refractive index layer has an impurity concentration of $1 \times 10^{20}$ cm$^{-3}$ or less.

8. A surface emitting laser, comprising:
an active layer; and
a first reflector and a second reflector disposed so as to sandwich the active layer, wherein
the first reflector includes the reflector according to claim 1.

9. The surface emitting laser according to claim 8, further comprising:
a first semiconductor layer disposed between the active layer and the first reflector; and
a second semiconductor layer disposed between the active layer and the second reflector, wherein
the first reflector is formed on a conductive substrate,
at least a laminate of the second semiconductor layer and the active layer has a mesa structure,
at least the first reflector has an opening, the opening having a conductive portion to electrically couple the substrate to the first semiconductor layer.

10. The surface emitting laser according to claim 9, wherein the first semiconductor layer has a film thickness of 1 µm or more.

11. The surface emitting laser according to claim 9, comprising a plurality of the mesa structures.

12. The surface emitting laser according to claim 11, wherein the opening is formed around each of the mesa structures.

13. The surface emitting laser according to claim 11, wherein a plurality of the openings is formed so as to surround each of the plurality of mesa structures, the plurality of the openings being shared by the mesa structures.

14. The surface emitting laser according to claim 13, wherein
arrangement of the mesa structures constitutes a lattice, and
the opening is formed at a position of a center of gravity of two closest lattice points of the lattice.

15. The surface emitting laser according to claim 8, wherein
the second reflector has a second laminated structure in which a second low refractive index layer and a second high refractive index layer having a refractive index higher than the second low refractive index layer are alternately laminated, and
an optical film thickness of the second high refractive index layer is different from an optical film thickness of the second low refractive index layer.

16. The surface emitting laser according to claim 15, wherein
the second reflector has a plurality of the second laminated structures, and
combined materials of the second low refractive index layer and the second high refractive index layer are different among the plurality of second laminated structures.

17. A light source apparatus, comprising:
the surface emitting laser according to claim 8; and
an optical element to adjust light emitted from the surface emitting laser.

18. The reflector of claim 1, wherein, in the low refractive index layer, the AlN layer is disposed closer to a central portion of the laminated structure than to an edge side of the laminated structure.

19. The reflector of claim 1, wherein the GaN layer adjacent to the high refractive layer is equal to or greater than 5 nm.

20. The reflector of claim 1, wherein in the laminated structure of said low refractive index layer the number of AlN layers is an even number that is equal to or greater than 2 and the number of GaN layers is an odd number that is equal to or greater than 3.

21. A retina display, comprising:
the surface emitting laser according to claim 8; and
an optical element to focus light emitted from the surface emitting laser.

22. A projector, comprising:
the surface emitting laser according to claim 8; and
an optical element to draw an image with light emitted from the surface emitting laser.

23. A headlamp, comprising:
the surface emitting laser according to claim 8; and
an optical element to project light emitted from the surface emitting laser.

* * * * *